(12) United States Patent
Oetzel

(10) Patent No.: US 12,318,858 B2
(45) Date of Patent: Jun. 3, 2025

(54) DIFFUSION SOLDERING AND/OR SINTERING DEVICE, DIE AND SYSTEM, FOR CONNECTING COMPONENTS OF AT LEAST ONE ELECTRONIC ASSEMBLY

(71) Applicant: PINK GMBH THERMOSYSTEME, Wertheim (DE)

(72) Inventor: Christoph Oetzel, Freudenberg Boxtal (DE)

(73) Assignee: PINK GMBH THERMOSYSTEME, Wertheim (DE)

( * ) Notice: Subject to any disclaimer, the term of this patent is extended or adjusted under 35 U.S.C. 154(b) by 0 days.

(21) Appl. No.: 18/700,497

(22) PCT Filed: Oct. 13, 2022

(86) PCT No.: PCT/EP2022/078481
§ 371 (c)(1),
(2) Date: Apr. 11, 2024

(87) PCT Pub. No.: WO2023/062116
PCT Pub. Date: Apr. 20, 2023

(65) Prior Publication Data
US 2024/0335900 A1 Oct. 10, 2024

(30) Foreign Application Priority Data
Oct. 14, 2021 (DE) .......................... 102021126718.8

(51) Int. Cl.
*B23K 20/00* (2006.01)
*B23K 20/02* (2006.01)
*B23K 101/40* (2006.01)

(52) U.S. Cl.
CPC ........ *B23K 20/026* (2013.01); *B23K 2101/40* (2018.08)

(58) Field of Classification Search
CPC ............ H05K 3/34; H01L 2224/75651; H01L 21/67144; H01L 2224/75701;
(Continued)

(56) References Cited

U.S. PATENT DOCUMENTS 7,793,819 B2 * 9/2010 Guth .................... B23K 1/0016
428/615
8,104,667 B2 * 1/2012 Guth .................... B23K 1/0016
228/6.2
(Continued)

FOREIGN PATENT DOCUMENTS

DE 102007047698 A1 4/2008
DE 102014114095 A1 3/2016
(Continued)

*Primary Examiner* — Erin B Saad
(74) *Attorney, Agent, or Firm* — Dinsmore & Shohl LLP

(57) ABSTRACT

The invention relates to a diffusion soldering device and/or sintering device, to a press tool and to a system comprising these for connecting components of at least one electronic assembly, in particular of a plurality of electronic assemblies, by means of diffusion soldering or pressure sintering. The device comprises an upper tool and a lower tool between which the assemblies are held, wherein the upper tool has at least one pressure pad filled or fillable with a fluid or displaceable medium whose internal pressure is variable and at least one, in particular several, plungers in operative connection to the pressure pad and configured for transmission of a press force, generated by a pressure increase in the pressure pad, to the assemblies.

Figure 1:
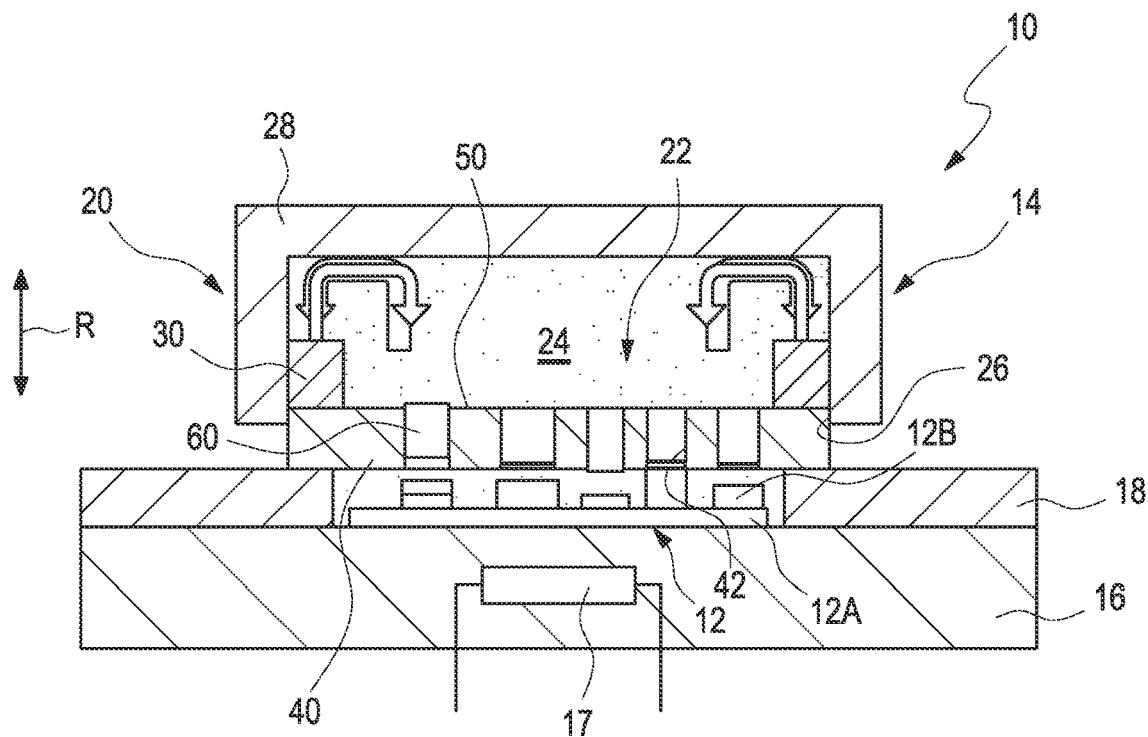

The present invention provides that the upper tool has a guide frame in which the plunger(s) is/are guided axially movable along the effective direction of the press force, and the plunger(s) is/are movably guided inside the guide frame while sealed against the pressure pad.

(Continued)

In a subordinate aspect, a press tool is proposed that is usable in an aforementioned diffusion soldering or sintering device, and a multi-module system comprising a press tool and/or an aforementioned device.

26 Claims, 13 Drawing Sheets

(58) Field of Classification Search
CPC .......... B23K 1/008; B23K 1/012; B23K 3/08; B23K 37/00; B23K 37/02; B23K 37/04
See application file for complete search history.

(56) References Cited

U.S. PATENT DOCUMENTS

| | | | | |
|---|---|---|---|---|
| 11,676,843 | B2* | 6/2023 | M?ssig | H01L 21/67173 |
| | | | | 438/106 |
| 2007/0205253 | A1* | 9/2007 | Hubner | B23K 1/008 |
| | | | | 228/193 |
| 2008/0230589 | A1* | 9/2008 | Guth | B23K 1/0016 |
| | | | | 228/44.3 |
| 2011/0017803 | A1* | 1/2011 | Guth | B23K 1/0016 |
| | | | | 228/6.2 |
| 2012/0248094 | A1* | 10/2012 | Strotmann | B23K 1/008 |
| | | | | 219/616 |
| 2022/0344178 | A1* | 10/2022 | M?ssig | H01L 21/67132 |
| 2024/0047413 | A1* | 2/2024 | Oetzel | H01L 21/68707 |

FOREIGN PATENT DOCUMENTS

| | | |
|---|---|---|
| DE | 102014114093 B4 | 3/2017 |
| DE | 102017216545 A1 | 11/2018 |
| DE | 102019134410 A1 | 6/2021 |
| EP | 3454364 A1 | 3/2019 |
| JP | 06275704 A | 9/1994 |
| NL | 2015895 B1 | 6/2017 |
| WO | 2016050466 A1 | 4/2016 |
| WO | 2017137420 A2 | 8/2017 |
| WO | 2018122795 A1 | 7/2018 |
| WO | 2021069328 A1 | 4/2021 |

* cited by examiner

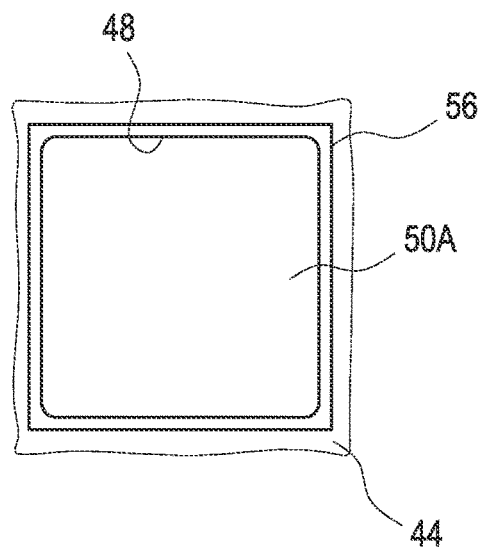
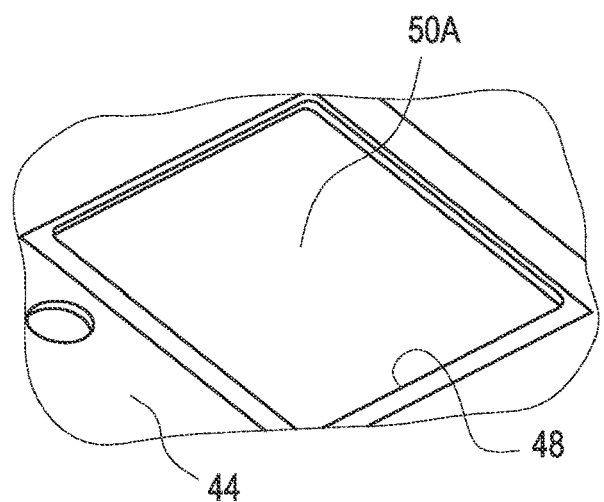
Fig. 9          Fig. 10
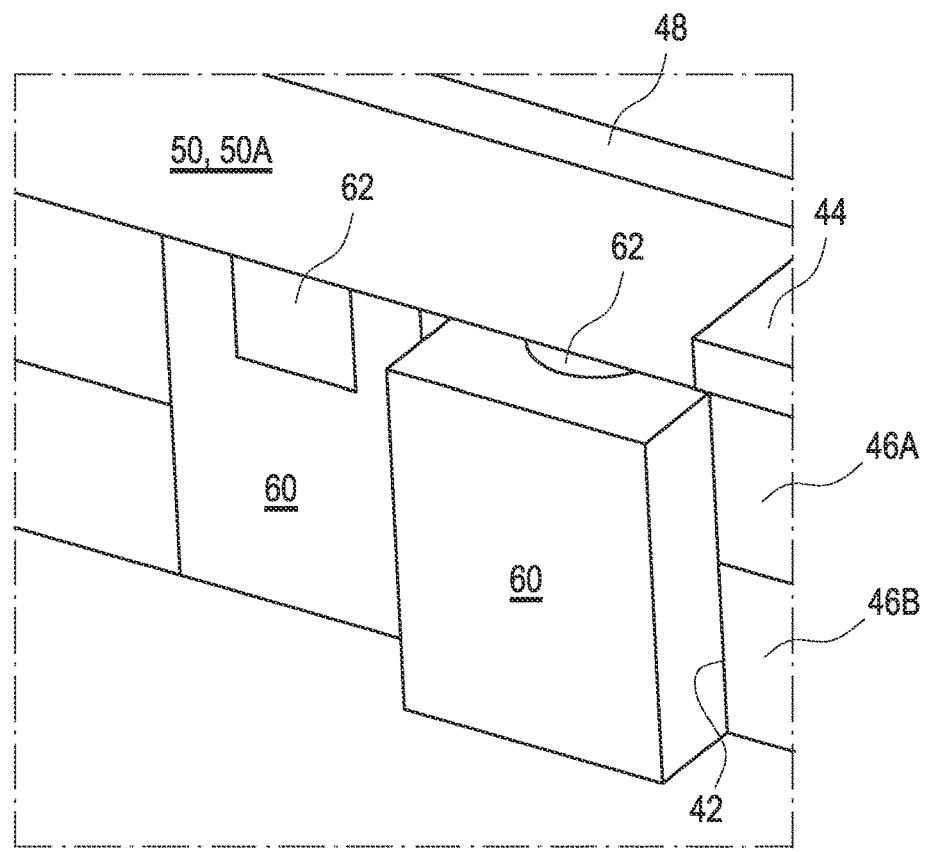
Fig. 11

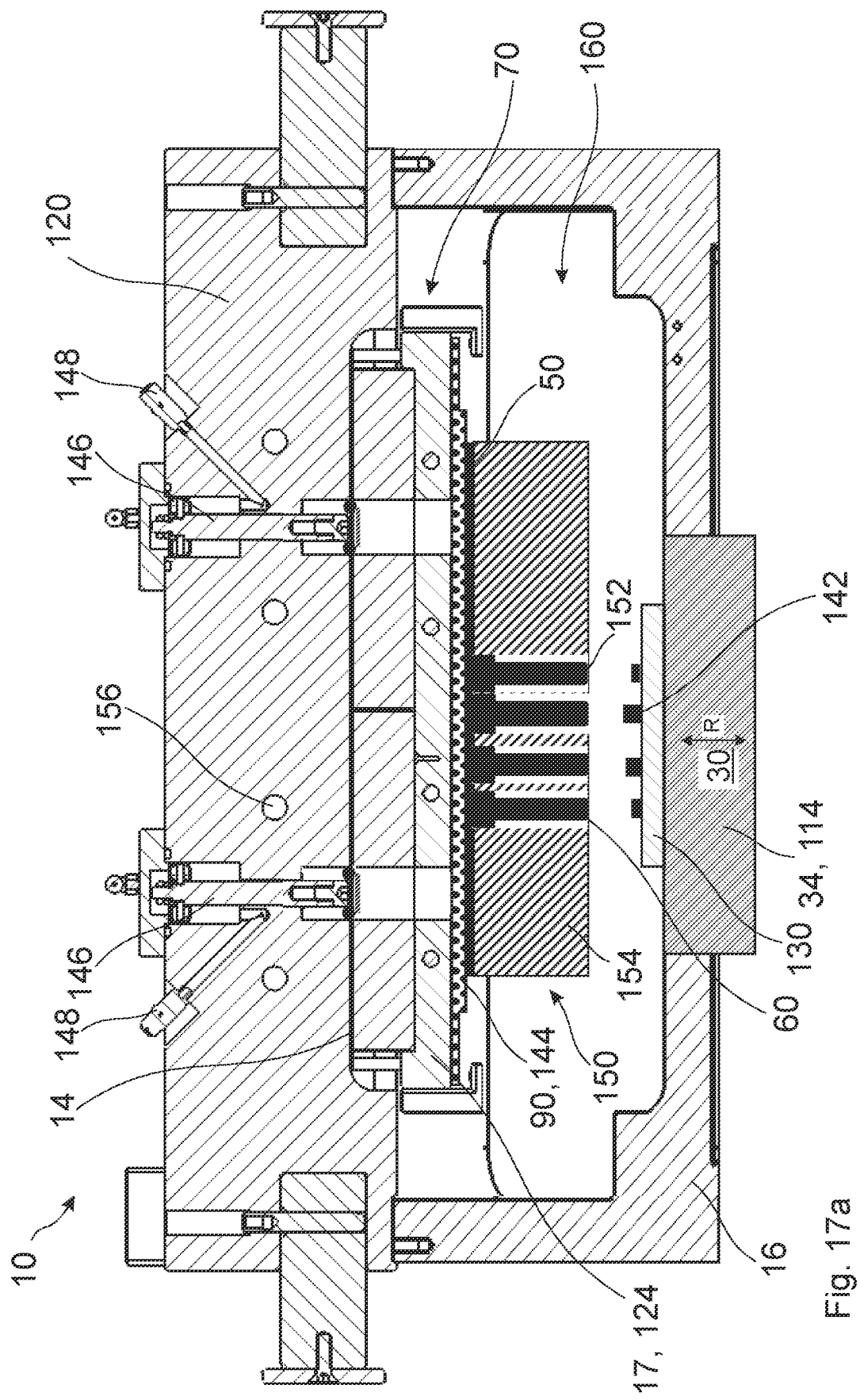

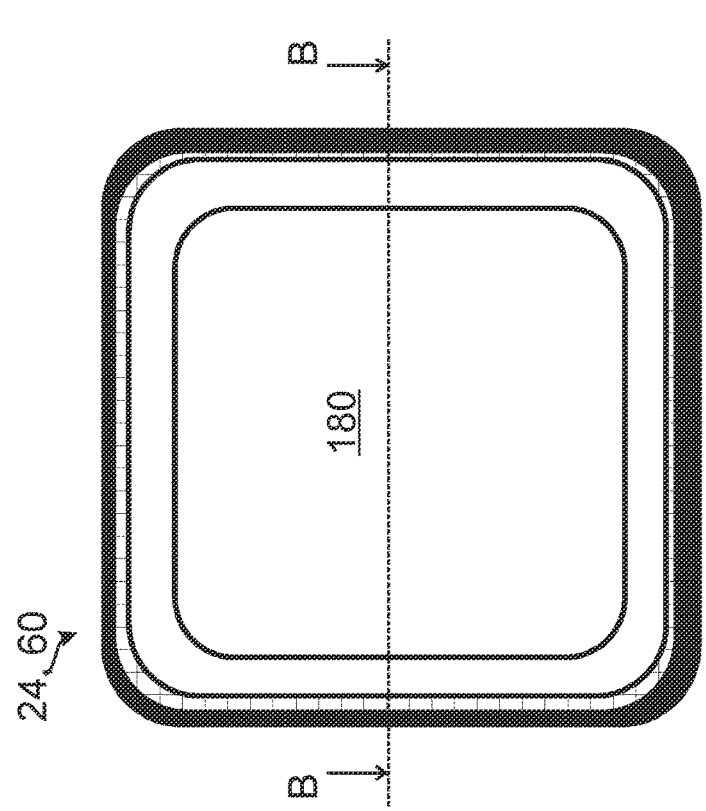
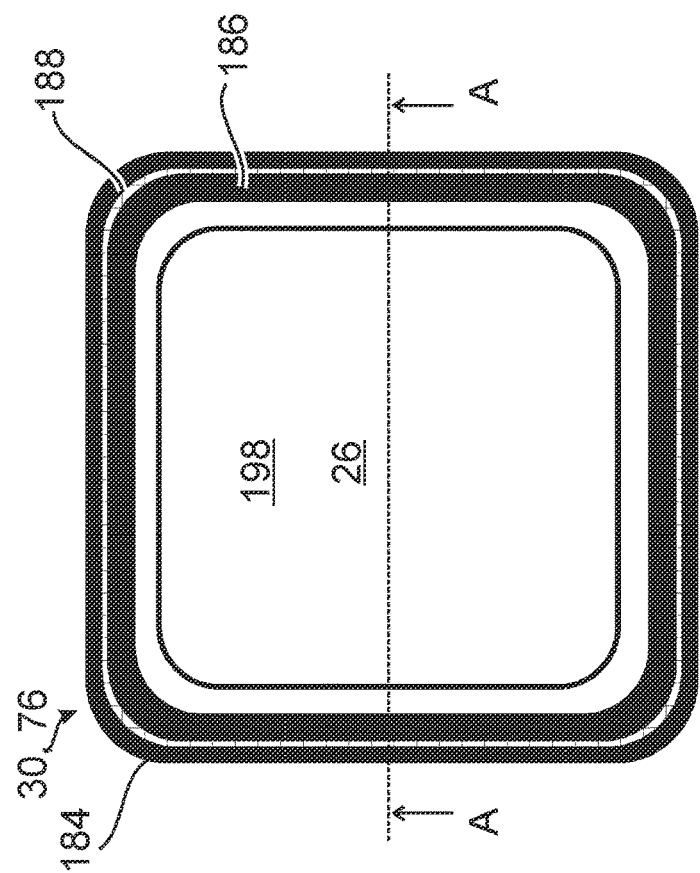
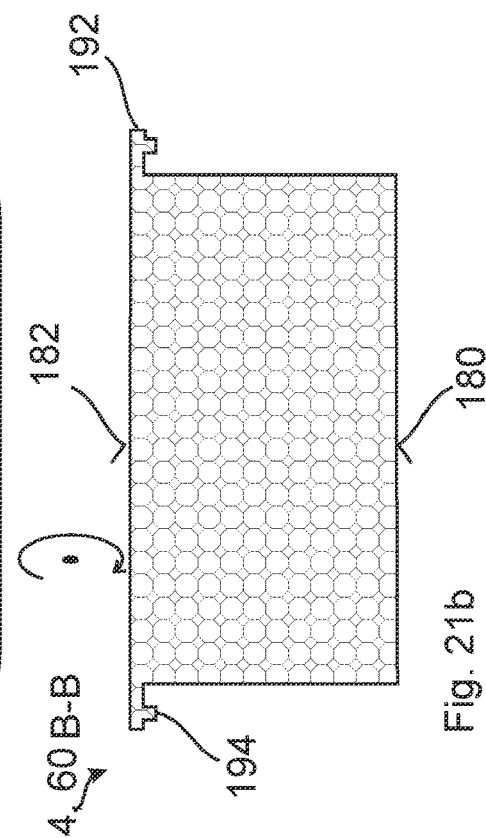
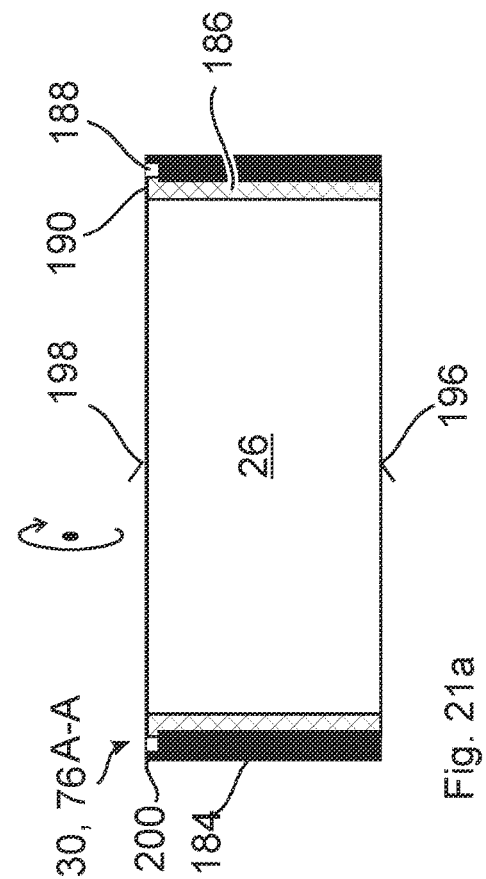
Fig. 21b
Fig. 21a

DIFFUSION SOLDERING AND/OR SINTERING DEVICE, DIE AND SYSTEM, FOR CONNECTING COMPONENTS OF AT LEAST ONE ELECTRONIC ASSEMBLY

CROSS-REFERENCE TO RELATED APPLICATIONS

This application is a U.S. National Phase of International Patent Application No. PCT/EP2022/078481, entitled "DIFFUSION SOLDERING AND/OR SINTERING DEVICE, DIE AND SYSTEM, FOR CONNECTING COMPONENTS OF AT LEAST ONE ELECTRONIC ASSEMBLY" and filed on Oct. 13, 2022, which claims priority to German Patent Application No. 10 2021 126 718.8 filed Oct. 14, 2021, the entire contents of each are incorporated herein by reference in their respective entireties.

The present invention relates to a diffusion soldering device and/or sintering device for connecting components of at least one electronic assembly by means of diffusion soldering and/or pressure sintering, with an upper tool and a lower tool between which the assembly is held, wherein the upper tool has at least one pressure pad filled or fillable with a fluid or with a displaceable medium whose internal pressure is variable and at least one, in particular several, plungers in operative connection to the pressure pad and configured for transmission of a press force, generated by a pressure increase in the pressure pad, to the assembly and of thermal energy.

PRIOR ART

In generic diffusion soldering and/or sintering devices, a solid workpiece can be produced under the effect of heat and pressure from a so-called green body consisting of a fine-grained or coarse-grained material or a material mix. The generic diffusion soldering and/or sintering device is used to connect components of electronic assemblies mechanically, electrically and thermally conductively to one another. For example, a generic diffusion soldering and/or sintering device can be used to connect electrical semiconductor parts, such as high-performance switching elements or semiconductor assemblies, and a basic body, for example a PCB, a heat sink or the like, to one another by means of diffusion soldering or pressure sintering. It has thus become commonplace in the field of power electronics to provide so-called mold modules, in which various electronic circuits and semiconductor parts can be integrated and which are as a rule equipped with contact pins for connection to an electronic system. These mold modules can be used for encapsulation of electronic components, where wire-bonded, soldered or glued microelectronic structures can be protected with a thermomechanically adapted and sturdy encapsulation material.

In diffusion soldering, atoms of the solid basic material are mixed with atoms of the liquid solder using a pressure. This results in an alloy zone which forms a substance-to-substance connection between the basic material and the solder. It is possible in a variant of pressure sintering—low-temperature pressure sintering—for two or more components, in particular electronic components and substrates, to be connected to one another in an electrically and/or thermally conductive manner by means of a joining material, the connecting joining material being sintered. A corresponding device and a method are known for example from WO 2014/135151 A2.

Connection methods are currently being developed which represent a combination of a diffusion soldering process and a sintering process, wherein the connecting means can use a combination of a diffusion solder and a sintering paste.

The required pressures can be up to 650 bar; applied temperatures of up to 350° C. are possible.

Generic diffusion soldering and/or sintering devices are frequently used in automatic sintering systems, in particular in automatic multi-chamber sintering systems.

The sintering or diffusion soldering of the electronic assemblies themselves is achieved by regulating the temperature of the assemblies to be sintered and/or of their components and by the action of a pressure imparted by the upper and lower tool. The temperature required for connection and diffusion during low-temperature pressure sintering with silver, for example, is regularly between approx. 130° C. and 250° C. to 300° C. and needs a duration of around 5 to 10 minutes at a pressure of up to 30 MPa.

To obtain during pressure sintering a layer parallel and as closed-pore as possible from the sintering material inserted between the components, to ensure a mechanically stable and in particular shear-resistant connection and also the required electrical and thermal conductivity, the joining layer is compacted by pressure before and during the diffusion process. Towards the end of the sintering operation, the pressure and the temperature are reduced.

One challenge is to apply the press force required for diffusion soldering or sintering to the assemblies in the most even manner possible, so that the components of the assemblies are not subjected to any local or temporary peak pressures. It is particularly demanding to prevent local peak pressures of this type during diffusion soldering or sintering of assemblies in which several electronic components of differing height are arranged on one substrate or workpiece carrier. Electronic components within the scope of the invention should be understood to be semiconductor components and electronic switching groups, as well as passive electrical components such as cooling elements like cooling plates, PCBs or connecting elements such as power pins, e.g. copper pins. An assembly is such a component or a connection of such electronic components to one another.

The following refers mostly to pressure sintering, however it also includes all aspects of diffusion soldering which are implementable in the same or a similar way as in a pressure sintering method in terms of the temperature and pressure applied in the joining process.

To permit the most even distribution possible of the press force or pressure, it was proposed in the prior art to use pressure pads for generating the pressure, the pads being in operative connection to several plungers of differing heights and transmitting the press force from the pressure pad to the assemblies.

A generic sintering device of this type is described in DE 10 2007 047 698 B4. A further sintering device with a pressure pad but without plunger is disclosed in DE 10 2014 114 095 B4.

EP 3 454 364 A1 relates to devices for encapsulating or sintering of semiconductor elements, and shows an upper tool and a lower tool with an assembly arranged between them. The upper tool shows a pressure application unit as a pressure pad, fillable with a fluid and with variable internal pressure, which interacts with plungers, referred to as spacers, for transmission to the assembly of the press force generated by the pressure increase in the pressure pad. The upper tool has a guide frame with guide ducts in which the plungers are axially movable along the press force with lateral tilting clearance. The pressure medium is provided in a pressure chamber, wherein a diaphragm is provided as a flexible membrane between the pressure medium and the plungers covering the guide ducts, in order to seal the guide ducts of the plungers against the pressure pad. The pressure chamber is connected to a supply for fluid to effect a pressure increase.

WO 2018/122 795 A1 shows a sintering device of the same generic type wherein plungers are arranged directly in a cylinder, so that a separate guide frame is dispensed with.

DE 10 2017 216 545 A1 shows a sintering device with an upper tool and a lower tool for sintering of an electronic assembly. A pressure pad comprises a hollow space and a membrane and is subjected to variable internal pressure via a fluid source. The pressure pad is connected via the membrane to press plungers, axially guided inside a guide frame GE, for transmitting the press force.

WO 2016/050 466 A1 relates to a generically similar sintering device, wherein a receptacle for a pressure pad is provided in a cylinder/piston arrangement.

One disadvantage of conventional diffusion soldering or sintering devices is that the pressure or press force often cannot be exerted in a sufficiently even and parallel way onto the assemblies to be sintered or diffusion-soldered. Pressure peaks or pressure gradients as well as parallel sintering layers can result which subject individual components to local loading or prevent the formation of uniform joining layers having the same mechanical, electrical and/or thermal properties at every point. A further drawback of known diffusion soldering or sintering devices can be that the press force is not built up in a simultaneous and parallel manner, i.e. it may be that the pressure builds up in certain areas earlier than in others, with the result that the pressing duration can spatially vary, which makes a controlled process more difficult and thus may also lead to varying quality. A further disadvantage of conventional diffusion soldering or sintering devices that have guided press plungers is that expensive sealing membranes or seals, which are prone to wear and which do not permit rapid and inexpensive resetting of the press tool, must be provided against a pressure space or a pressure pad.

DESCRIPTION OF THE INVENTION

The object of the invention is to indicate a diffusion soldering and/or sintering device which is configured to generate a press force, homogeneous in space and time, onto at least one assembly, in particular a plurality of assemblies.

The object is achieved by a diffusion soldering and/or sintering device having the features of claim 1. Advantageous embodiments of the diffusion soldering and/or sintering device are given in the dependent claims.

The present invention provides that the upper tool has a guide frame in which the plunger(s) is/are axially movable along the effective direction of the press force. The plunger(s) is/are movably guided inside the guide frame while sealed against the pressure pad. The guide frame and the sealed plunger(s) guided therein thus seal the pressure pad against the press surface and prevent any damage to the pressure pad. The axial guidance of the plunger(s) ensures that the press force required for diffusion soldering or pressure sintering is transmitted with the required homogeneity in terms of both time and space from the pressure pad onto the assembly to be sintered or soldered. The plunger(s) can be heatable or permit a rapid transmission of thermal energy onto the assembly to be sintered or soldered. The transmission can in any event take place selectively and faster than has been previously possible with a large-surface individual plunger, in particular with an individual plunger with a pressure pad, in particular a silicone pad. The plunger(s) is/are accordingly movably guided in or against the effective direction of the press force. The plunger(s) here can exert press forces selectively settable at least due to their geometric design and are mechanically connected directly to one another.

Sealing can be achieved either by a sealing membrane between the pressure pad and the guide frame or the upper side of the plunger(s), or by a sealing element of the plunger(s) inside the plunger guide in the guide frame.

The pressure pad preferably comprises a volume which is limited by a flexible, bendable and/or stretchable pad membrane and which is filled with an incompressible or compressible fluid or a displaceable medium such as a gel or similar. The fluid or the displaceable medium can be present in the pressure pad, and/or suppliable or replenishable from the outside before or during a diffusion soldering and/or sintering operation, for example in the form of a hydraulic supply. The equalizing medium held inside the volume of the pressure pad can usually be a fluid or another viscous medium, i.e. a displaceable substance, such as an elastomer, for example silicone, thermal oil, thermally conductive paste or thermally conductive grease. The fluid used can for example be hydraulic oil, but also silicone or perfluoropolyether (PFPE). PFPE, known as Galden HS260, has a boiling point of 260° C., and can for example be pumped out in the event of any leakage of the pressure pad by means of regularly provided vacuum pump.

The pressure pad can also be filled with gas or powder, or for example be provided in the form of a foil such as a graphite foil, or be designed as a soft metal, in particular one softer than iron, for example aluminium, lead, gold, indium, copper, platinum, silver, zinc or tin. A thin elastic foil such as a graphite foil can also be used for creating a parallelism between the upper plunger and the lower plunger. Generally speaking, the fluid can also be a gas, for example nitrogen. Furthermore the use of other gaseous substances, in particular also steam, is possible. The fluid can thus preferably be a gas or another displaceable medium, and for example be PFPE (Galden), silicone, $CO_2$, argon, nitrogen, helium, Igumix (a gas mixture) and mixtures or combinations of elastomers, oils, greases and/or gases. The volume may be self-contained or also have an access via which fluid can be supplied or removed, as described in the following in connection with a preferable embodiment.

Preferably, the pressure pad can be designed as a silicone pad.

In accordance with an advantageous embodiment of the invention, the upper tool has at least one pressure unit with a receptacle for the pressure pad. The receptacle enclosing the pressure pad, preferably from several sides, holds the pad both in a working position and in a rest position in which no press force is exerted on the assembly, and ensures a homogenization of the press force with stable support for the pressure pad. Several pressure units may be provided, in particular when each pressure unit receives a pressure pad for an individual plunger, every individual plunger having a relatively large plunger surface, as is the case for example in soft plungers. Soft plungers consist, unlike hard plungers, of a soft material such as silicone or a soft metal on the plunger surface.

According to a further advantageous embodiment, the pressure unit has an opening which faces the lower tool and is covered by the guide frame wherein the pressure pad rests on the guide frame. The opening thus allows the pressure pad to achieve an operative connection to the plunger(s)

guided in the guide frame. The guide frame provides at the same time further support to supplement the support by the receptacle in the pressure unit.

According to a further advantageous embodiment, the pressure unit has a cylinder and a piston movably received therein, wherein the cylinder and the piston define the receptacle for the pressure pad such that the volume of the receptacle is variable by moving the piston. Insertion of the piston into the cylinder thus leads to a reduction in the volume of the receptacle, thereby increasing the pressure prevailing in the pressure pad. This pressure increase generates the press force required for diffusion soldering or pressure sintering. The cylinder can at the same time act as a guide frame if an individual plunger or a so-called multiplunger is used, as explained below.

When the piston moves out of the cylinder, the volume of the receptacle increases again and the pressure prevailing in the pressure pad drops, thereby reducing the press force.

In this respect, it is preferable when the opening is provided in the piston. The piston is thus located on a side of the pressure unit facing the lower tool and is for example designed as an annular piston.

According to a further advantageous embodiment, the upper tool and the lower tool are movable relative to one another along the effective direction of the press force, wherein the piston is moved into the cylinder when the upper tool contacts the lower tool or a workpiece carrier resting on the lower tool. The press force is generated indirectly in this configuration, i.e. by a relative movement between the upper tool and the lower tool. This relative movement can be achieved by suitable means, for example by hydraulic or spindle drives. The movement of the piston relative to the cylinder is accordingly achieved indirectly or passively; a direct drive effecting this relative movement between piston and cylinder is not required. The piston is preferably connected to the guide frame. Hence the pressure in the pressure pad is not increased until the upper tool makes contact with the lower tool or with a workpiece carrier mounted thereon which carries the electronic assemblies to be sintered.

In accordance with an advantageous embodiment of the invention, the pressure pad is connected or connectable to a fluid source for supplying fluid into the pressure pad, wherein the pressure increase can be effected by the supply of fluid. The fluid can be a liquid or a gas. The fluid source can be heatable and/or coolable, so that the supplied fluid is usable for heating and cooling. In particular, the fluid source can comprise a heat exchanger, in particular a tubular heat exchanger for regulating the temperature of the fluid. It is conceivable that liquid metal too is used as the fluid. Fluids or displaceable metals can for example be poured in the hot liquid state, then solidify, and after installation in the sintering facility be liquefied by a heater of the sintering facility and thus remain liquid or liquefied. For example, tin solder can be used here to match the sintering process temperature.

Alternatively or additionally to the change in the volume of the receptacle described above due to a movement of the piston into the cylinder, the pressure in the pressure pad can also be increased by supplying further fluid to the pressure pad. The fluid source can for example be a pump or another suitable reservoir for fluid suitable for achieving the fluid supply. The fluid may be in liquid or in gaseous form, with PFPE (Galden) for example being suitable as the fluid, which is advantageously usable in both liquid and gaseous form as the pressure homogenization fluid. If the fluid source is provided additionally to the cylinder/piston arrangement described above, the supply of fluid into the pressure pad can effect a further pressure increase, even if a further movement of the piston into the cylinder is no longer possible or desired, for example because a mechanical limit on the movement distance has come into effect.

Preferably. PFPE can be used as the fluid both in liquid form and, depending however on the temperature range, also in gaseous form, and used both for heat transmission and for pressure equalization. PFPE is a group of plastics which are usually liquid to pasty at room temperature; in particular a perfluoropolyether with a boiling point of for example 260° C., also known as Galden HS260 (HS260=260° C. boiling point), is used in vapor phase soldering. A crucial advantage over thermal oils is that in the event of a fracture or leak in a membrane of the pressure pad the escaping fluid is harmless for the components. The fluid can also be evaporated in a vacuum chamber by means of a vacuum and pumped out of the chamber via the vacuum pump.

According to a further advantageous embodiment, the guide frame comprises a plunger guide plate having guide ducts for axial guidance of the plunger(s). The guide ducts extend preferably in the effective direction of the press force at least through the plunger guide plate and ensure lateral guidance of the plunger(s), thereby permitting an exact positioning of the plunger(s) relative to the components of the assembly. The plunger guide plate can be designed in one piece or in two or more pieces.

According to a further advantageous embodiment, at least one flexible membrane is arranged between the pressure pad and the plunger(s). The membrane acts here as a kind of additional mechanical protective layer, preventing in particular the pressure pad from being inadvertently damaged by local pressure peaks during application of pressure to the plungers.

In this respect, it has proved advantageous for the membrane to cover the guide ducts. This prevents in particular the pressure pad being pressed into any gaps that might be present between the plunger(s) and the walls of the guide ducts. This ensures that the pressure increase in the pressure pad is available in full to generate the press forces acting on the effective cross-section of the press plungers, and does not lead to local bulging out of the pressure pad into any gaps or cavities.

According to a further advantageous embodiment, the guide frame has a membrane holding plate which is arranged on a side of the plunger guide plate facing the pressure pad, wherein the membrane is held between the membrane holding plate and the plunger guide plate. The membrane holding plate thus fixes the membrane on the plunger guide plate and in particular also ensures additional pretensioning of the membrane.

In this respect, it has proved advantageous when the membrane holding plate has at least one penetration which extends at least over the guide ducts. The penetration can be designed as a large central penetration covering the plunger guide plate only in its peripheral area and there fixing the membrane between the membrane holding plate and the plunger guide plate. The membrane holding plate preferably has however several separate penetrations, each penetration being associated with a single guide duct or preferably with a group of guide ducts. In particular, the size and arrangement of the penetrations correspond to a size and arrangement of an associated substrate with which electronic components are to be connected by the diffusion soldering operation or pressure sintering operation. The guide ducts are accordingly not covered by solid sections of the membrane holding plate, so that the plunger(s) can be in an operative connection to the pressure pad via the membrane.

According to a further advantageous embodiment, the plunger(s) is/are permanently or detachably connected to the membrane, preferably bonded. The connection between the plunger(s) and the membrane ensures that the plunger(s) cannot fall downwards out of the guide frame when the diffusion soldering and/or sintering device is in a rest position in which the upper tool is at a distance from the lower tool.

According to a further advantageous embodiment, the upper tool has at least one securing device for the plunger(s) which secures the plunger(s) against dropping out of the guide ducts.

In this respect, it has proved advantageous when the membrane is magnetic and the securing device comprises respective magnetic elements, connected to the plunger(s) and preferably integrated into the plunger(s), which hold the plunger(s) on the membrane. As a result, the magnetic elements are held removably or detachably on the membrane. This has the advantage that both the plunger(s) and the membrane are reusable when the diffusion soldering and/or sintering device have to be adjusted to other assemblies that have components with differing dimensions, in particular a different height, from previously processed assemblies. The advantage here over permanently bonded plungers is in particular that possibly only some of the plungers need to be replaced. That reduces the setting times and costs. The magnetic membrane can be a part of the securing device. The magnetic elements also permit an easy reconfiguration, resulting in a quick-change system for the plunger(s) that can be adjusted to the altered assembly configurations. For example, a single assembly or a plurality of assemblies is regularly arranged in a workpiece carrier which is guided during processing through the diffusion soldering and/or sintering device. A change in the assembly type or in the arrangement inside the workpiece carrier necessitates reconfiguration of the plunger arrangement. A quick-change system, in particular using magnetic elements, will make this considerably more simple and less expensive.

In accordance with an alternative embodiment, the securing device comprises respective securing pins mounted in the plunger guide plate and extending though recesses provided in the plungers. With this configuration too, replacement of the plunger(s) can be performed. The securing pins preferably have sufficient clearance inside the recesses that the required axial movability of the plungers for the diffusion soldering and/or sintering operation is assured. To do so, the recesses can for example be designed as slots. The securing pins extend with their longitudinal axis preferably inside a plane defined by the main extent direction of the plunger guide plate. Appropriate mounting recesses or grooves for the securing pins, for example in the form of depressions, can be made in the plunger guide plate. To allow fitting and/or replacement of the plungers or of the securing pins, the plunger guide plate can be designed in two parts with an upper and a lower plunger guide plate.

According to a further advantageous embodiment of the invention, the plunger(s) are held in the guide ducts with lateral clearance. Should the contact surfaces between the components to be sintered and the plungers not be exactly parallel due to production tolerances, the lateral clearance of the plunger(s) in the guide ducts permits a slight tilting of the plunger(s) in order to achieve parallelism between the contact surfaces. As a result, uneven pressure application on the components is prevented and the risk of pressure peaks occurring is reduced. The clearance can be from approx. 1 µm to 1 mm and can in particular be designed as a parallel gap between the plunger and the guide duct.

As a rule, the plunger(s) has/have a round cross-sectional shape. In a further embodiment, the plunger(s) can have an elliptical, square or rectangular cross-section. The guidance sides, i.e. the cross-sectional corner areas of the plunger(s), are preferably rounded here to prevent local pressure peaks. The plunger is limited by a plunger upper side facing the pressure pad, by a plunger underside facing the pressing side and the component to be pressed, and by an axial plunger outer jacket guided inside the guide frame. The side surfaces of the plunger outer jacket are referred to as guidance sides and are guided inside the guide duct. The edge transitions of the guidance sides are advantageously rounded to ensure guidance without canting. A rectangular or square design in particular of the plunger underside, but also of the entire plunger cross-section, permits an adjustment of the plunger cross-section to a typical design of components to be sintered, in particular high-performance semiconductor components with rectangular or square housing shapes, and permits a multi-plunger unit having a plurality of adjacent and mutually sealing plungers guided along each other, without any gap arising between the plungers, such that the multi-plunger unit without limiting walls for the guide frame forms a closed sealing surface against the pressure pad. The multi-plunger unit can be sealed by a metal foil against the pressure pad, wherein it is furthermore possible to magnetically connect the individual plungers of the multi-plunger unit to the metal foil.

With regard to the above embodiment, it may furthermore be advantageous for the guide frame, in particular the plunger guide plate, to have a square or rectangular form, and for the guide ducts to have a square or rectangular cross-sectional shape. This achieves sealing of the pressure pad by the guide frame and by the plungers guided inside sealed guide ducts, even if no additional membrane is used for sealing. A rectangular or square shape allows better use of the surface in relation to the press force, and more components can be processed with the same force per surface than with round ones.

In an advantageous embodiment, one or more guide ducts can hold a plurality of closely adjacent plungers that are preferably guidable along each other. This embodiment proposes a multi-plunger unit as a plunger package, wherein the guide frame has one or more guide ducts and several plungers are guided in one guide duct. The plungers are here axially guided along each other inside the duct in self-sealing manner and have contours permitting planar sealing by the multi-plunger surface over the guide duct cross-section. The plungers can thus have shapes concentric with one another, or be guided adjacent to one another in rectangular or square shape. Other complex cross-sectional shapes that fill the guide duct are also conceivable. It is advantageous here that the plungers have the same or differing lengths relative to one another, to permit pressing of components with a constant or varying height profile.

In a further advantageous embodiment, the plunger(s) can have a sliding guide insert made of a softer material, preferably plastic, than the plunger material on an upper guidance side section facing the pressure pad. Preferably, an all-round plunger groove can be provided on the plunger upper side between the upper edge of the sliding guide insert and the plunger upper side. The sliding guide insert can provide efficient sealing of an upper area of the plunger facing the pressure pad against the guide frame or adjacent plungers, and can be replaced inexpensively when worn. The sliding guide insert for fastening the plungers can also fasten the plunger in the guide ducts of the guide plate in a non-positive or positive manner. For efficient sealing, an all-round plunger groove, in particular a plunger groove bounded by sharp edges, on the upper end of the sliding guide insert opposite the surface of the plunger upper side in which the pressure pad can take effect has proven advantageous. If the material of the sliding guide insert consists of a softer material than the plunger material, typically plastic versus metal, then the plunger material has a higher thermal expansion coefficient as a rule and hence seals better at higher temperatures. In addition, the softer material can ensure parallel alignment of the plunger relative to the surface of the component or of the assembly. Due to the all-round plunger groove, the pressure pad material, e.g. silicone, flows into the plunger groove and presses the sliding guide insert against the outer wall of the guide duct. If furthermore the surface of the sliding guide insert facing the plunger guide side has a friction-reduced surface contour, e.g. a profiled corrugated surface, then the axial plunger movement is sealed with reduced resistance and the sliding guide insert remains in place on the guidance side of the plunger. The sliding guide insert can preferably be manufactured on the basis of a 3D printing technology and in particular printed or injection-molded onto an upper all-round plunger guidance side section directly adjacent to the plunger groove. Dependable sealing inside the guide ducts of the guide plate is made possible by an increased thermal expansion coefficient of the material of the sliding guide insert. By using the sliding guide insert, a sealing effect against the pressure pad can be achieved which is so effective that a membrane as the sealing element can be dispensed with. A multi-plunger unit as mentioned above can be advantageously used as the plunger, wherein at the upper end of the sliding guide insert a metal foil can provide sealing against the pressure pad located above it. Furthermore, the individual plungers of the multi-plunger unit are magnetically fixable on the metal foil in a non-positive connection.

In a further advantageous embodiment, the plunger(s) can have a smaller or larger cross-section on the plunger underside than on the plunger upper side. Differing surface cross-sections of the plunger upper side from the plunger underside permit an increase or reduction in the pressure and also efficient sealing of the pressure pad. Areas of components to be sintered can be adaptively pressed with increased or reduced pressure, and the cross-sectional contour of the plunger underside can also be adapted to specific requirements of the component geometry.

In a further advantageous embodiment, the piston can be guided movably while sealed against the cylinder. The piston is used to increase the pressure in the pressure pad, which as a result presses the plungers from the upper tool in the direction of the lower tool. By the closing movement of the upper and lower tools, a press force, which the piston transmits to the pressure pad, is exerted on the piston movable inside the cylinder and resting on the lower tool, in particular on the assembly or a workpiece carrier. For sealing, the plunger(s) can be sealed in the guide plate against the pressure pad for example using a large membrane, in particular using a metal membrane, or each plunger can be sealed inside the guide plate singly or as a group against the pressure pad, for example using membrane sections or by additional sealing elements at the plungers. The plunger can here be formed by an underside of the pressure pad, in particular of a silicone pad, which presses the assembly directly or with an inserted process covering, such as a sintering foil or the like. The sintering foil can assist parallel alignment of the plunger of the upper tool relative to the surface of the component or of the assembly on the lower tool. Furthermore, a sintering foil can prevent adhesion of the silicone material to the component surface. The piston is also preferably formed as an annular piston, and preferably comprises a piston skirt of a harder material, in particular steel, and a piston sealing insert of a softer material, in particular plastic, positively held in the piston skirt. The piston sealing insert of a softer material can, due to heating up and application of pressure, seal the pressure pad in the opening of the pressure chamber such that it cannot bulge out at the gap between the piston and the cylinder of the pressure unit. The material selection for the piston sealing insert can, when adjusted to the pressure, temperature and material of the pressure pad, ensure sealing of the pressure pad in the cylinder when pressure is applied. Furthermore, the piston sealing insert assists, due to its yielding and soft property, parallel alignment of the plunger surface on the component surface and is used for parallel alignment of the plunger surface of the upper tool with the component surface of the lower tool. The cylinder cross-sectional shape can be preferably circular to provide an even distribution of the pressure. By using the piston sealing insert, however, elliptical, square, rectangular, polygonal or other cylinder cross-sectional shapes are conceivable, which, when adapted to the assemblies to be processed, permit in particular a compact and space-saving arrangement of assemblies on workpiece carriers and a high production rate even at high temperatures and pressures. Cross-sectional shapes, in particular square or rectangular cross-sectional shapes with rounded edge areas, are preferable for permanently ensuring the tightness of the piston/cylinder seal against the pressure pad. The annular piston can have a clearance from the cylinder wall to permit sliding of the annular piston inside the cylinder, wherein any penetration of the pressure pad material—even without intermediate membrane—into the gap between annular piston and cylinder can be prevented due to the aforementioned sealing. In the interior of the annular piston, it is possible for the pressure pad to be in gap-free contact with the inner wall of the piston sealing insert. To that extent, the plunger is in this embodiment guided without a gap inside the guide duct formed by the inner wall of the annular piston.

In a further advantageous embodiment, the piston skirt can have a sealing seat on its piston upper side facing the upper tool, in which seat a flange area of the piston sealing insert engages such that an all-round sealing groove can be formed. A pressure pad can preferably have on the upper side an all-round sealing edge which, when pressure is applied to the piston, can be forced into the sealing groove of the piston with a seal seam being formed. Due to the engagement of a flange area of the piston sealing insert in a sealing seat of the piston skirt, it is firstly possible to positively hold the piston sealing insert, and secondly to form a sealing groove that provides space for displacement of the pressure pad, so that a self-sealing effect of the pressure pad against the gap between piston and cylinder is assured due to the sealing groove. The piston sealing insert can be easily replaced when worn or when resetting.

In a further advantageous embodiment, the piston and the pressure pad can be associated with a plunger, in particular the plunger can be designed as a soft plunger and can preferably be provided by the pressure pad, or the piston and the pressure pad can be associated with a plurality of plungers. In this embodiment, it is proposed that one or more pressure units can be arranged in the upper tool, wherein each pressure unit has an individual plunger. If the pressure unit substantially consists of the cylinder with received pressure pad, annular piston and guide frame, each pressure unit can form an individual plunger. The underside of the pressure pad can for example act as a soft plunger, e.g. as a silicone plunger, but also be designed as a hard plunger with a hard plunger surface. Alternatively, a single large pressure unit can be arranged in the upper tool, wherein a plurality of small plungers can be arranged in the guide frame.

In a subordinate aspect, a press tool designed as an upper tool or a lower tool of an aforementioned diffusion soldering and/or sintering device is proposed. This comprises a rigid baseplate and either at least one membrane connected to the baseplate and formed by a flexible, preferably dish-shaped membrane preferably made from silicone or a steel alloy, or a number of membrane sections, in the direction of the press surface, or a guide frame with sealed plungers movably guidable therein, and with a pressure chamber preferably comprising a pressure pad filled with a fluid and arranged in a closed receiving space limited by the baseplate and the membrane or the guide frame with sealing plungers, wherein the guide frame closes the pressure pad in the direction of the press surface and guides the plungers. The membrane(s) and/or the plunger seals seal the pressure chamber/pressure pad, preferably of silicone, against the press surface and permit the arrangement of the plungers on the membrane surface/guide frame, wherein for example a magnetic fastening is facilitated in the case of metallic membranes, however with other connection methods such as bolted, welded or riveted connections or similar being conceivable.

In an advantageous development, a sub-area of the pressure chamber of the previously described press tool, in particular at least one sub-area of a pressure pad held in the pressure chamber, can be designed controllably fluid-fillable, in particular gas-fillable. Preferably, the fluid filling can be controllable by means of at least one filler valve. Due to the fluid filling, in particular gas filling, of a sub-area of the pressure chamber, in particular a sub-area, a press force can be generated by a fluid filled into the pressure chamber, additionally or alternatively to the press force mechanically applied by the press. It is thus possible—for example by introducing atmosphere gas of the process chamber, if necessary also a purging gas such as nitrogen etc., into a sub-area of the pressure chamber when the pressure is reduced or a vacuum is created in the process chamber—that the pressure chamber expands through the membrane or by moving the sealed press plunger. This generates a comparatively low yet in many cases sufficient pressure, for example for a bonding method, for low-pressure sintering with silver or copper, for diffusion soldering at for example up to 0.4 MPa, for thermocompression bonding at for example up to 0.1 MPa etc., onto the components without a hydraulic press mechanically operating the press plungers. It is thus possible, solely by setting a defined process atmosphere in the process chamber and/or pressure chamber, for an exactly dosable press force to be applied to the component which could not have been applied using a mechanical press by movement of the lower and upper tools relative to one another.

With the aforementioned embodiment, a press tool can be provided inexpensively and easily with minor effort for pressure application additionally or alternatively to the press drive. This is because a required and controlled sintering pressure or diffusion soldering pressure or bonding pressure can be exerted on components using the gas pressure and the process atmosphere/vacuum in the process chamber generally required for the process, in order to compensate for height differences of parts on the component.

To do so, no additional force measuring system or pressure measuring system is necessary, as a vacuum pressure sensor and a simple software area conversion are sufficient to obtain a required and set sintering pressure or diffusion soldering pressure or bonding pressure.

Since the vacuum chamber exerts pressure in a vacuum on the component(s) via the press tool, it is possible to continuously monitor during the process whether oxygen is penetrating into the vacuum chamber from the outside, since an unexpected chamber pressure increase can be detected immediately. This ensures that the hot component, in particular copper surfaces, does not oxidize. Pressure monitoring of the components can be performed using a load cell which is for example comprised in the press drive. For example, sticking of a plunger can be detected.

In a further subordinate aspect, a diffusion soldering facility and/or sintering facility is proposed that comprises an aforementioned diffusion soldering device and/or sintering device and/or an aforementioned press tool. It is proposed that the diffusion soldering device and/or sintering device and/or the press tool be arranged in an atmospherically tight module of a multi-module system, in particular in a vacuum module, wherein at least one further module is provided as a preheating and/or cooling module. Furthermore, a transport device is provided which is configured to automatically move at least one workpiece carrier, in particular the lower tool, with at least one assembly through the multi-module system. Adjacent modules of the multi-module system are also sealable atmospherically tight against one another.

In other words, a multi-module system is proposed that comprises at least one atmospherically tight module, in particular a vacuum module, which comprises the aforementioned sintering or diffusion soldering device and/or the aforementioned press tool. Inside this sintering/diffusion soldering module, the sintering and/or diffusion soldering process can be performed under specifically settable atmospheric conditions, in particular in a vacuum to eliminate oxidation processes. At least one further module can be configured as a preheating module and/or as a cooling module for reduction of process times and for specific pretreatment and/or after-treatment, e.g. for cleaning in particular using a process gas such as plasma, formic acid, nitrogen etc. and for temperature regulation. A workpiece carrier supporting at least one, in particular several assemblies or components, can be guided by a transport device, e.g. a conveyor belt system, through the modules. The entire lower tool can also be passed through the multi-module system by means of the transport device. The transition of the modules can be sealable to be atmospherically tight, e.g. sealable by means of a gas lock, such that atmosphere, pressure and temperature can be set separately in every module. The multi-module system can be designed for batch operation in flow production and as a throughput system, with the transport device either passing the assemblies through the multi-module system, or passing them in and back out.

DRAWINGS

Further advantages emerge from the following drawing description. The drawing shows examples of the invention. The drawing, the description and the claims contain many features in combination. The person skilled in the art will also consider the features individually, and combine them into useful further combinations. Examples shown for a sintering device shown can equally be used for diffusion soldering devices.

Figure 2:
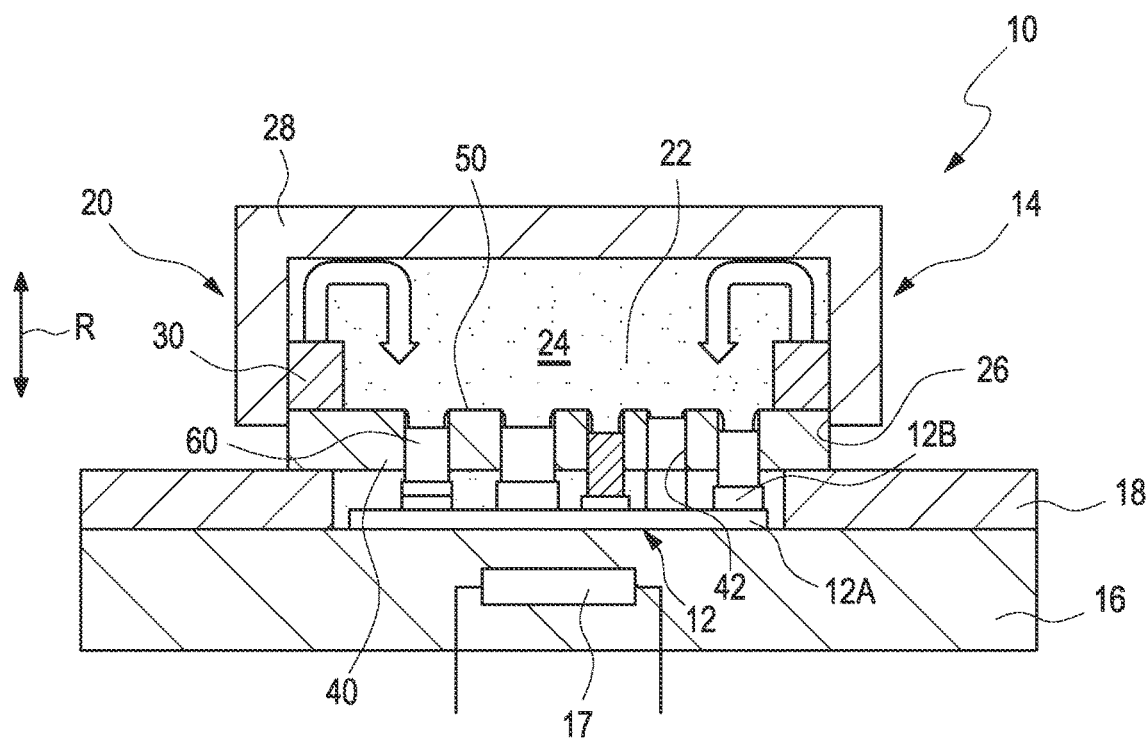

In the figures:

FIG. 1 and 2 show schematic sectional views of a sintering device in accordance with an example in different working positions.

Figure 3:
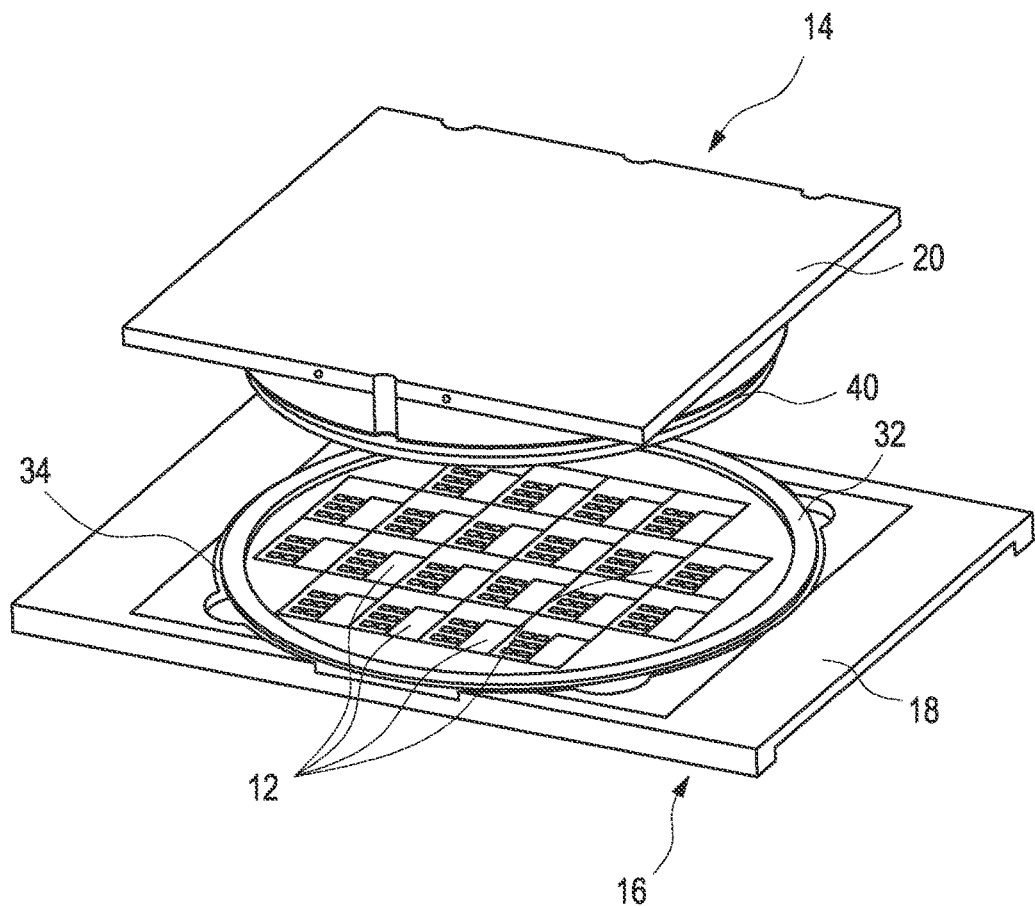
Figure 4:
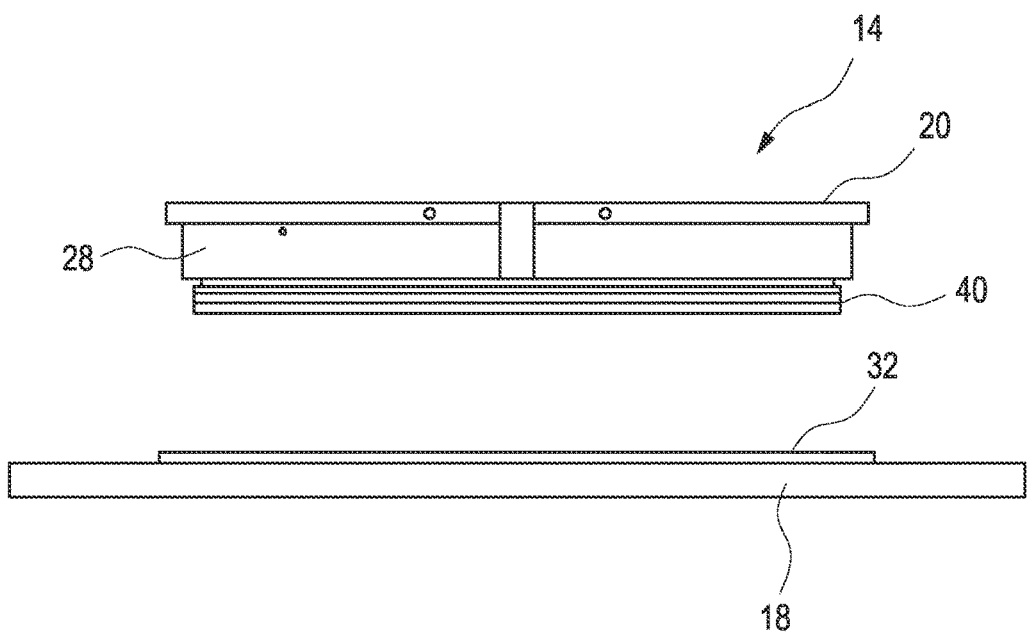
Figure 5:
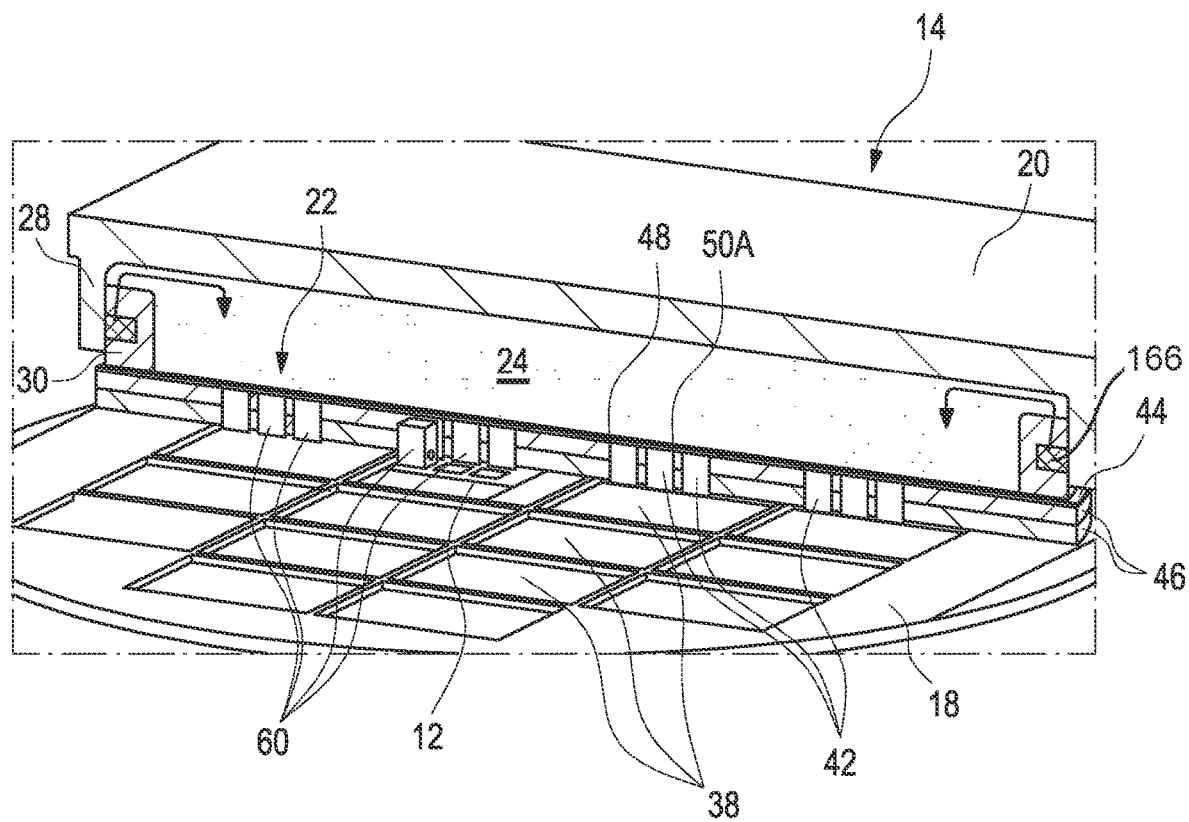
Figure 6:
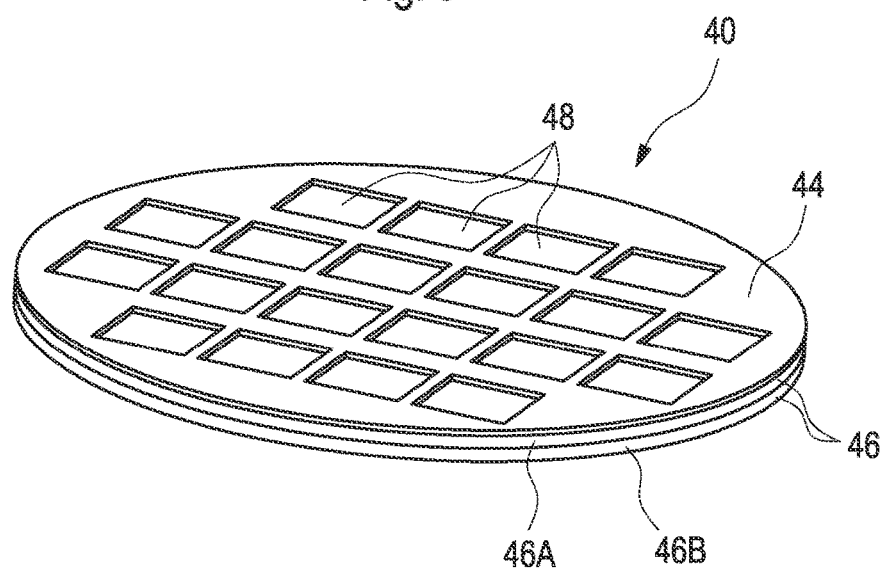

FIG. 3 a perspective view of the sintering device of FIGS. 1 to 2 in a rest position, FIG. 4 a perspective view of the sintering device of FIGS. 1 to 3 in a partial sectional representation, FIG. 5 a side view of the sintering device of FIGS. 1 to 4, FIG. 6 a perspective view of a guide frame of the sintering device of FIGS. 1 to 5, FIG. 7 a perspective exploded view of the guide frame of FIG. 6.

Figure 7:
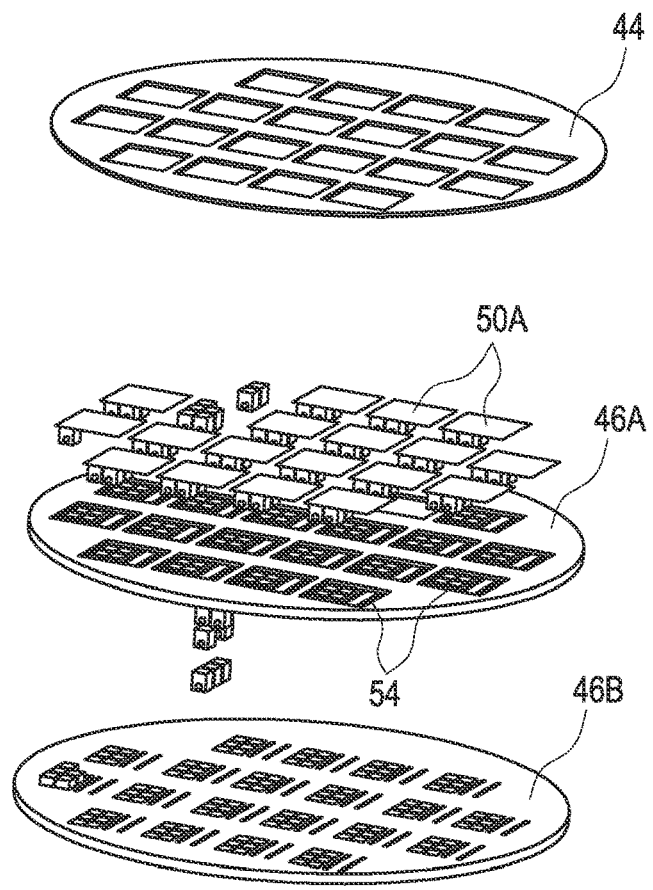
Figure 8:
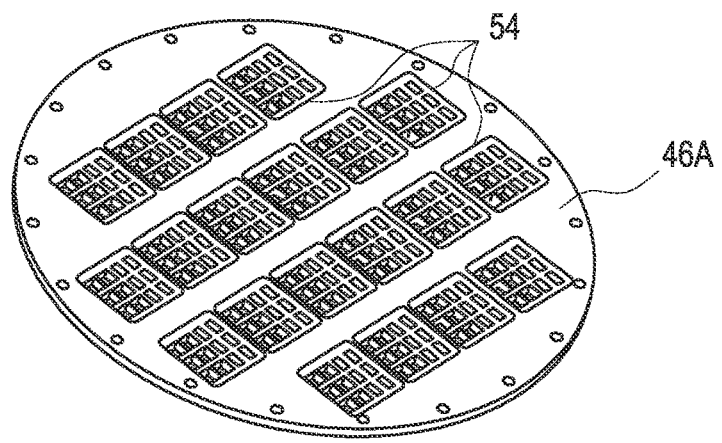

FIG. 8 a perspective view of a component of the guide frame of FIG. 7.

Figure 12:
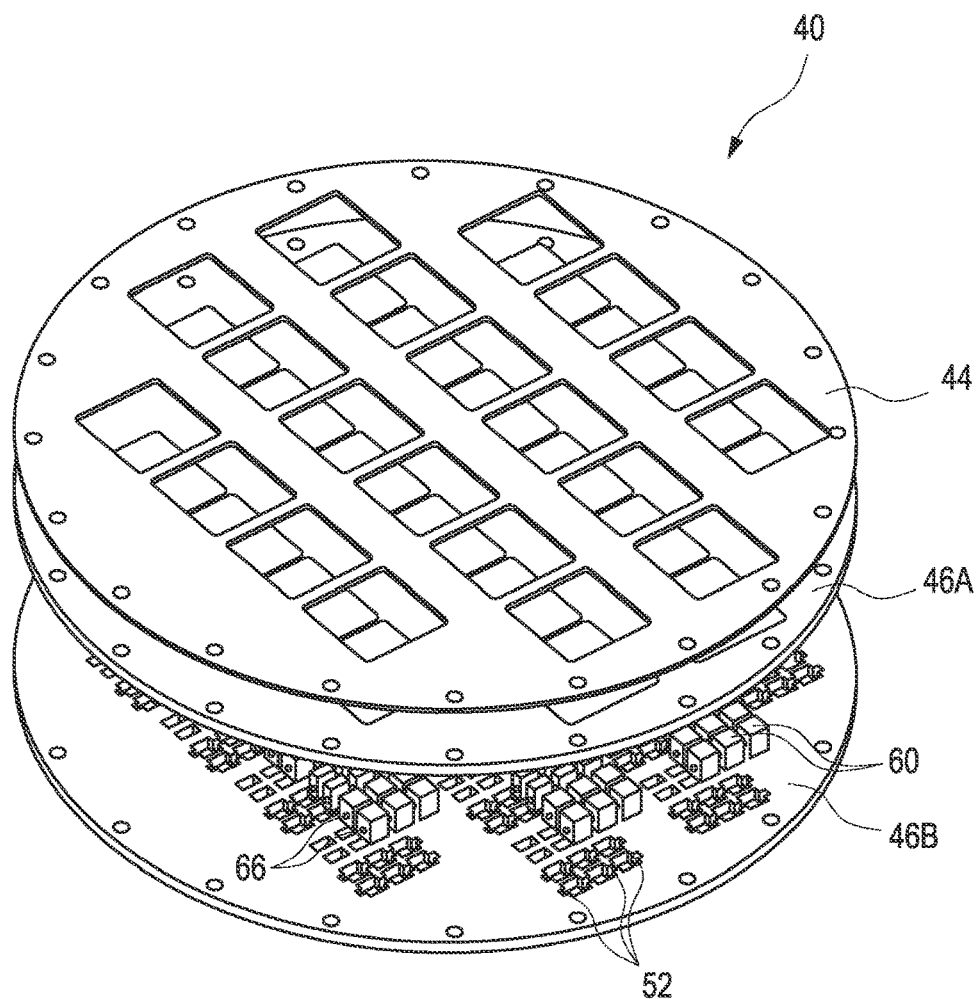
Figure 13:
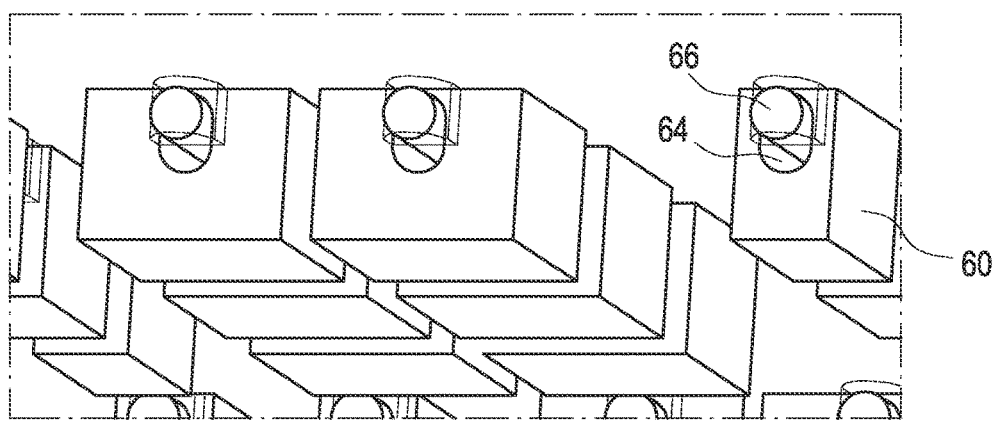
Figure 14:
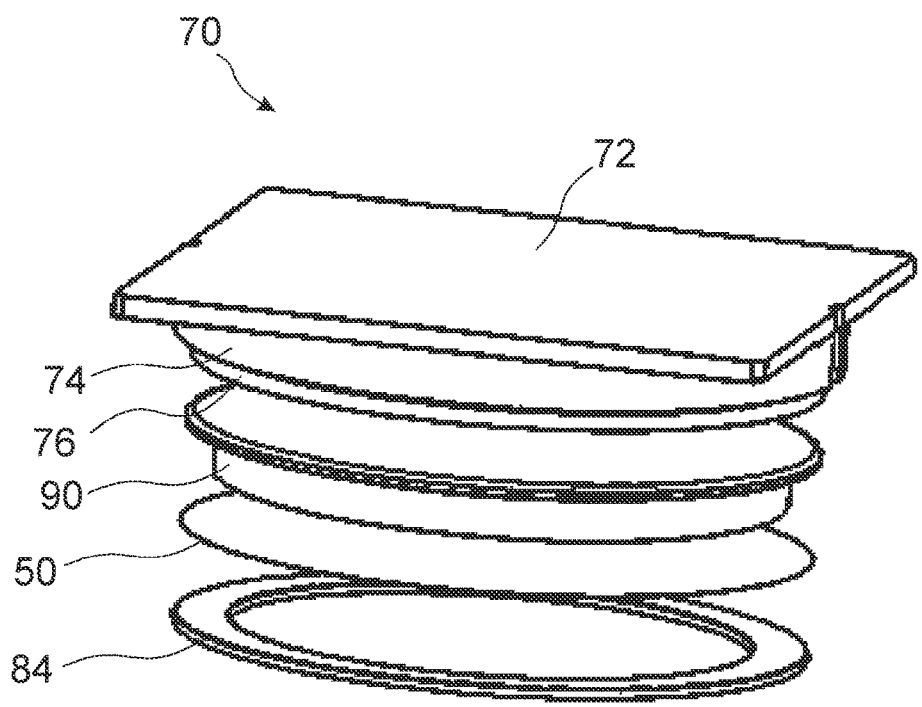
Figure 15A:
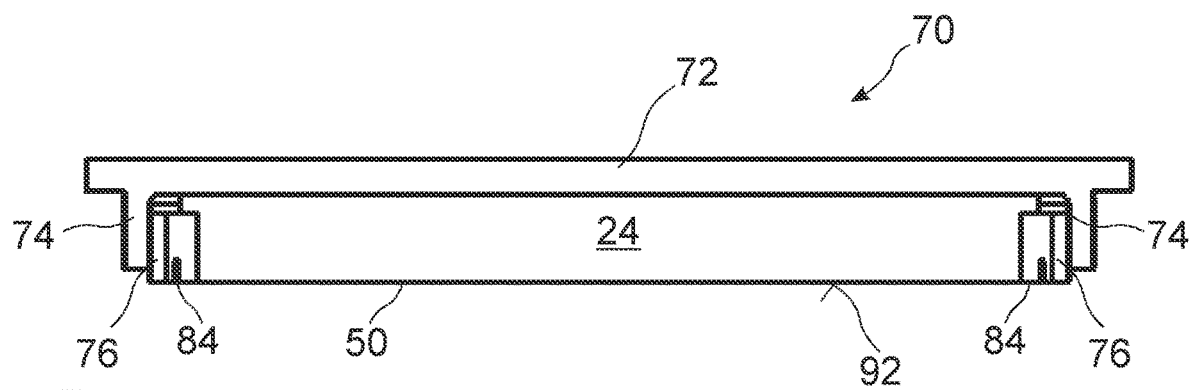
Figure 15B:
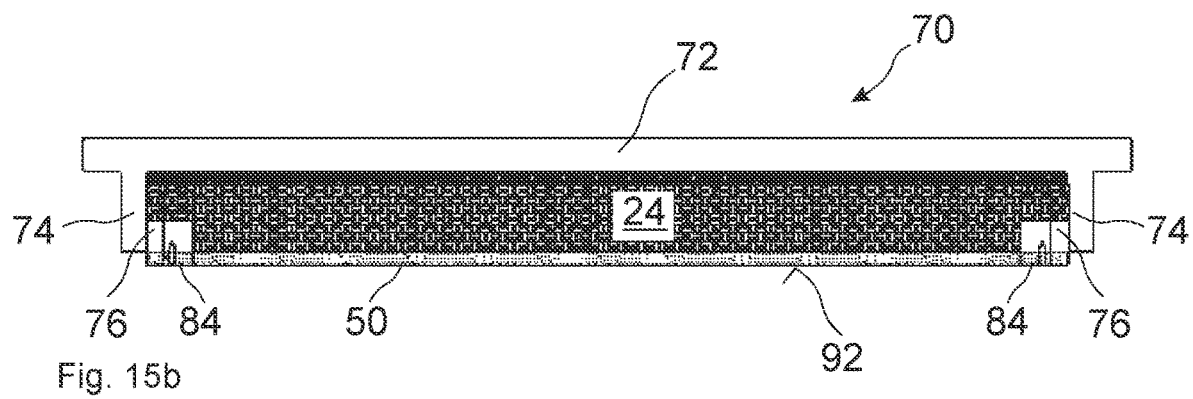
Figure 16:
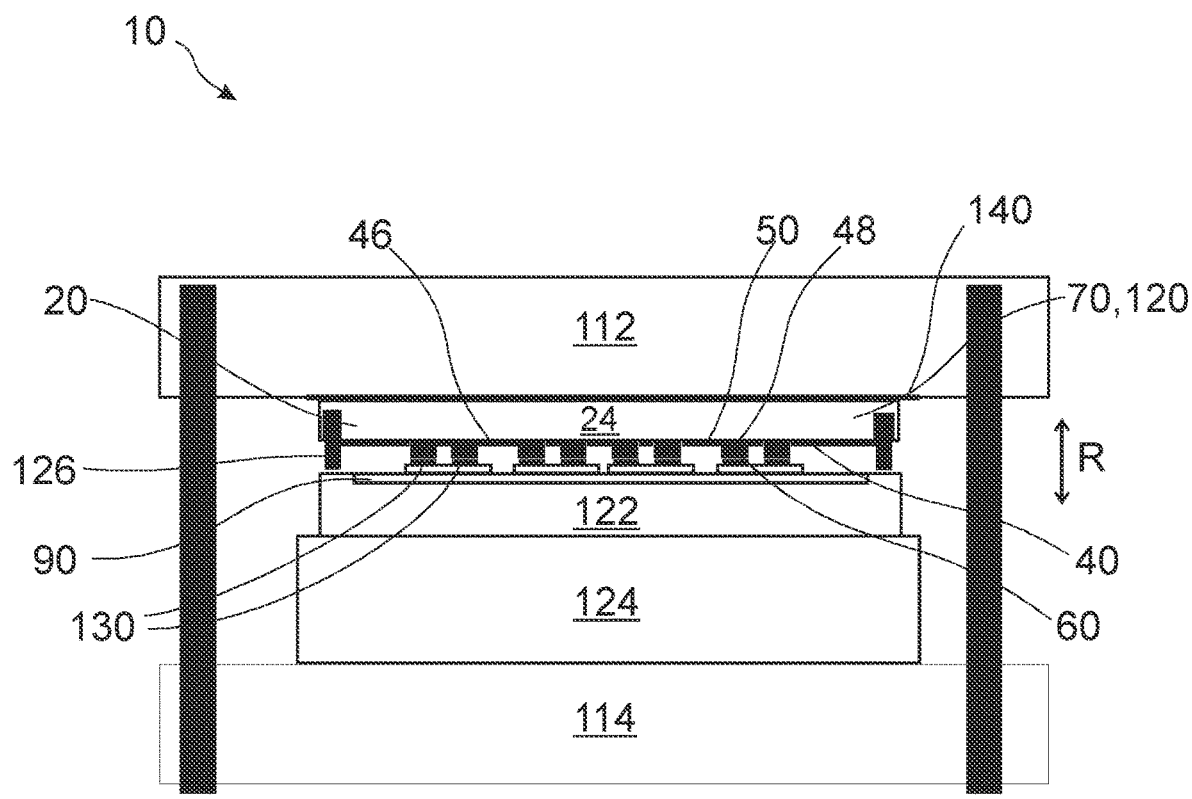
Figure 17B:
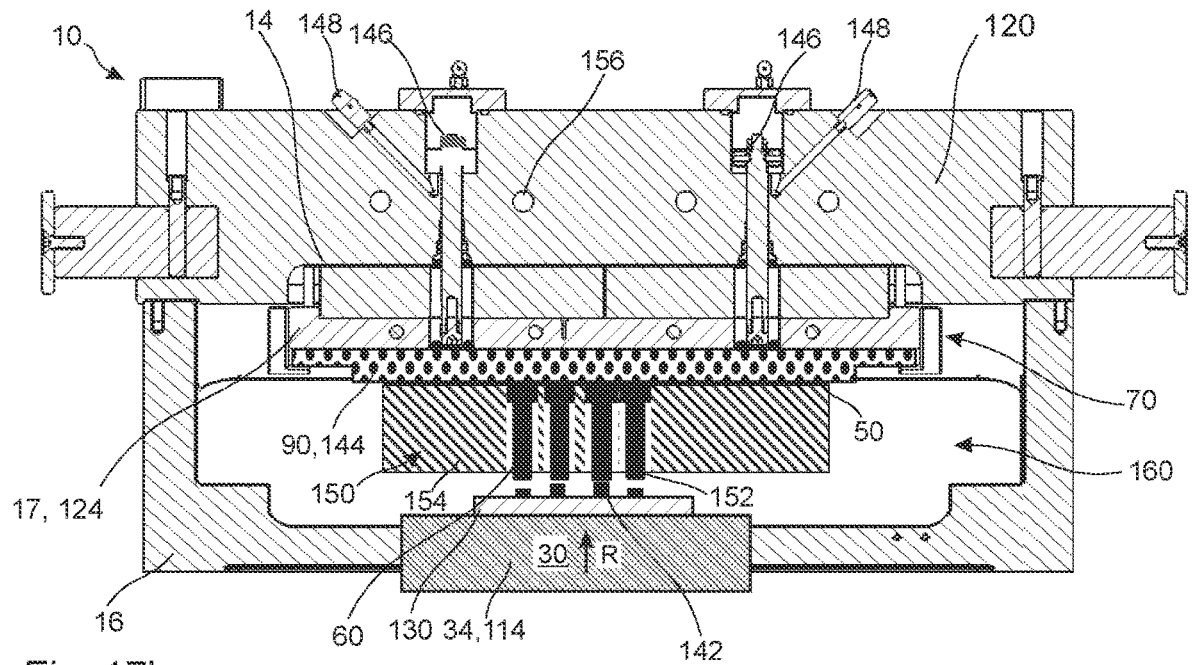
Figure 17C:
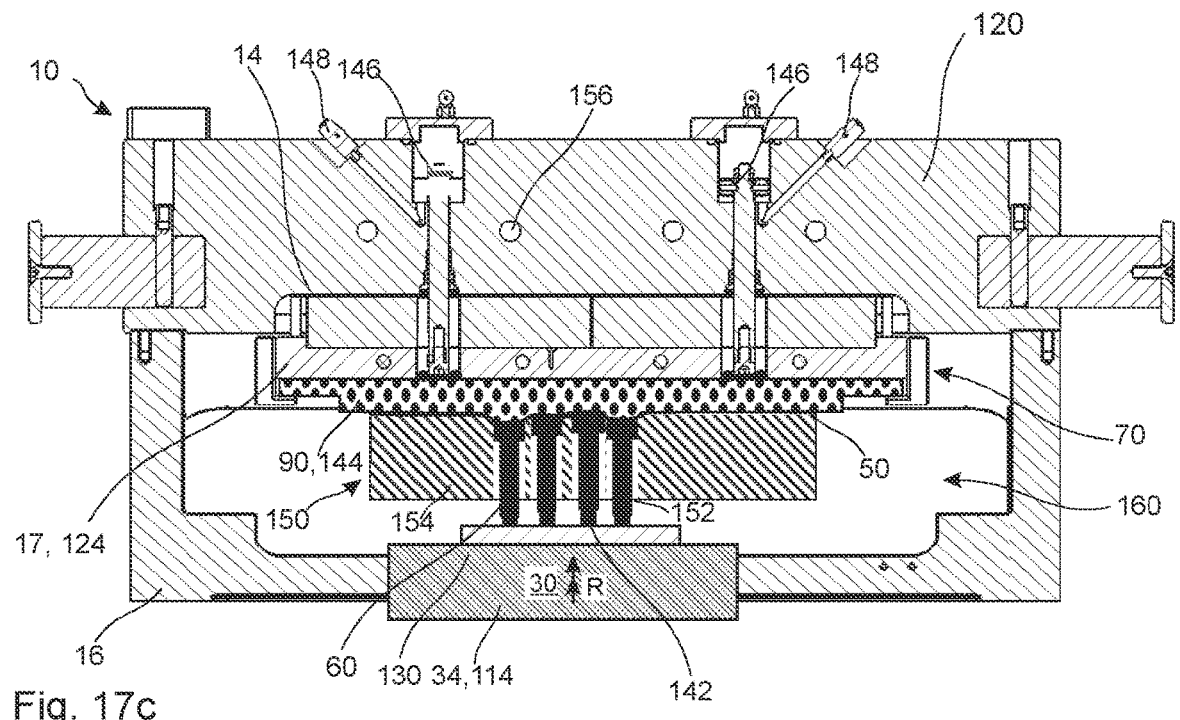
Figure 18A:
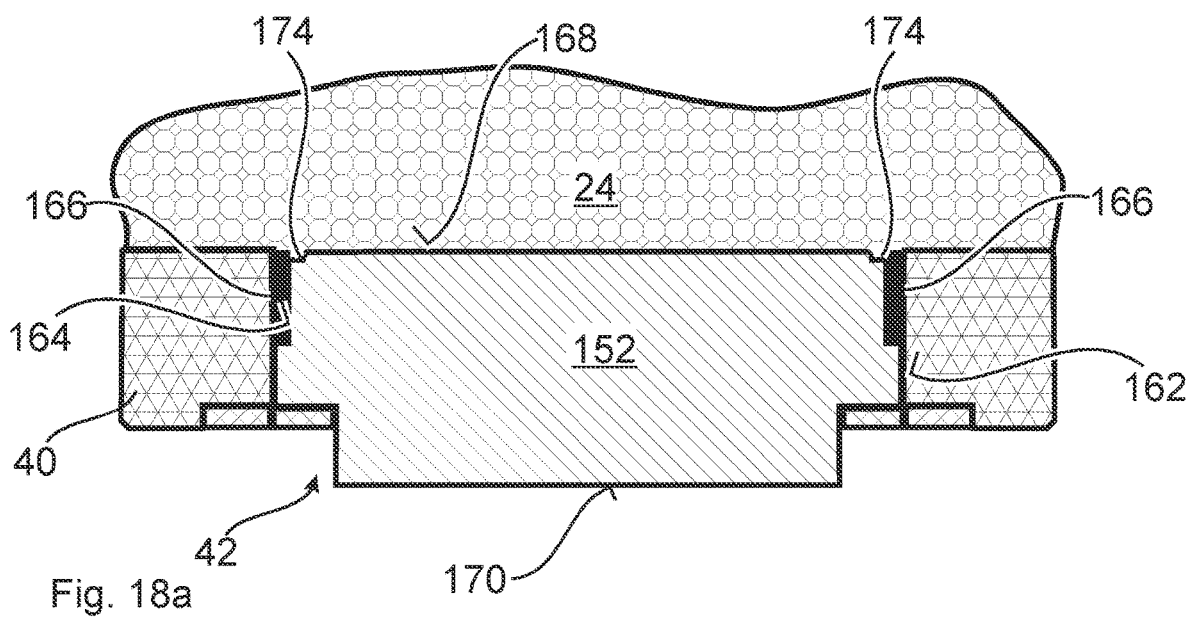
Figure 18B:
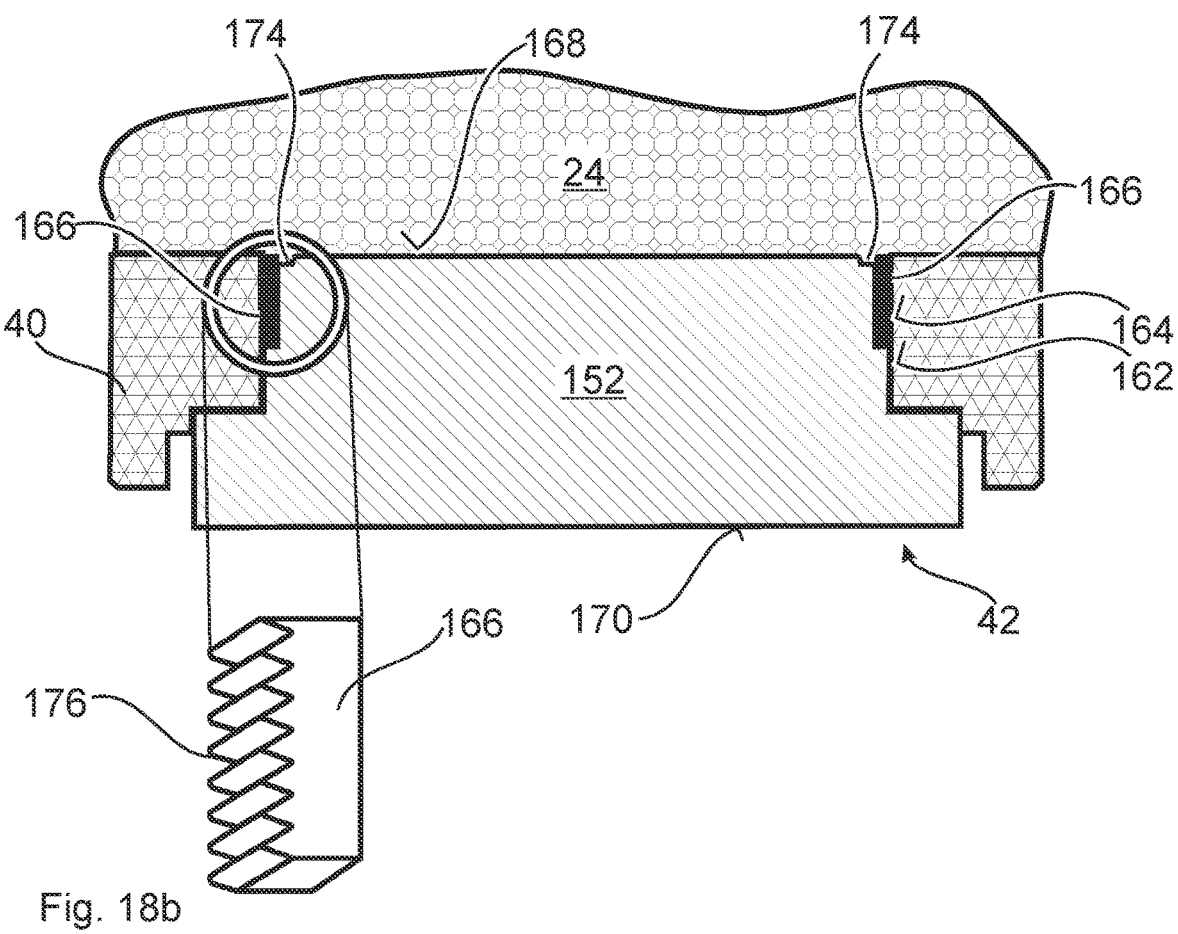
Figure 19:
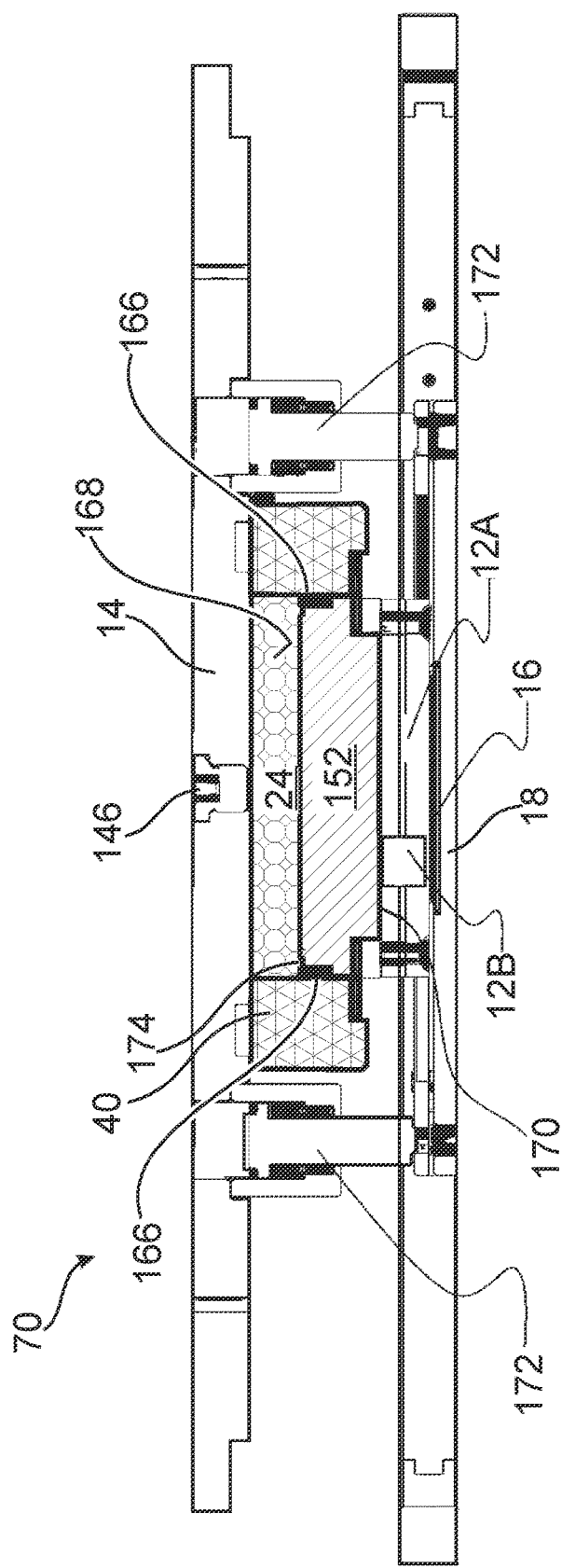
Figure 20:
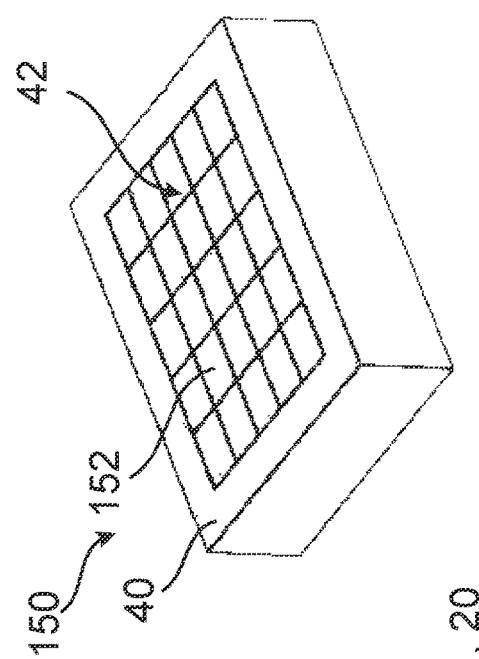

FIGS. 9 and 10 partial views of the guide frame of FIGS. 6 and 7 from various perspectives, FIG. 11 a perspective partial view in a sectional representation of the guide frame of FIGS. 6 and 7 in accordance with a configuration, FIG. 12 a perspective view of a guide frame in accordance with a further configuration, and FIG. 13 a perspective partial view in sectional representation of the guide frame of FIG. 12;

FIG. 14 an exploded representation of a press tool of a sintering device in accordance with an embodiment of the invention;

FIGS. 15a, 15b a sectional representation through variants of the embodiment according to FIG. 14;

FIG. 16 a schematic side view of a sintering device of a further example;

FIGS. 17a-17c a further press tool in several process stages of a sintering device in accordance with an example;

FIGS. 18a, 18b sectional representations of sealed press plungers in accordance with embodiments of the invention;

FIG. 19 an embodiment of a press tool with a sealed press plunger shown in FIG. 18a;

FIG. 20 in perspective a multi-plunger unit of an embodiment with mutually adjacent and movable plungers sealed against one another;

FIGS. 21a, 21b plan view and sectional view of a square annular piston with silicone pressure pad of an example of the invention.

In the following description of exemplary embodiments and configurations, identical or similar elements are indicated with the same reference numerals.

FIGS. 1 and 2 show an exemplary sintering device 10 for connecting components of a plurality of electronic assemblies 12 by means of pressure sintering. It is however also possible to sinter only a single assembly 12. For reasons of clarity, FIGS. 1 and 2 each show only a single assembly 12, which comprises a substrate 12A and several differently sized electronic components 12B.

The sintering device 10 comprises an upper tool 14 and a lower tool 16, which are movable relative to one another along a pressing direction R shown by a two-headed arrow R. For reasons of clarity, further components of the sintering device 10 such as adjusting devices or holding devices for the tools 14, 16 are not shown.

The upper tool 14 and the lower tool 16 can be heatable, wherein only one heating device 17 provided on the lower tool 16 is shown here for more simplicity.

The assemblies 12 to be sintered can in accordance with a configuration be held in a workpiece carrier 18, which can preferably be inserted in automated manner into the sintering device 10 for a simplified workpiece change by means of appropriate transport devices, placed on the lower tool 16, and removed again from the sintering device 10 after completion of sintering.

The upper tool 14 comprises a pressure unit 20 defining a receiving space or a receptacle 22 for a pressure pad 24 which completely fills the receptacle 22. The pressure pad 24 defines a volume which is enclosed by a fluid-tight and flexible envelope or pad membrane and filled with a fluid, for example an elastomer such as silicone or grease or also with a gas. The envelope can for example be made from a coated glass fiber or aramid fiber fabric (Kevlar). The coating can for example be manufactured using polytetrafluoroethylene (PTFE).

The pressure unit 20 comprises a cylinder 28 in which a piston 30 is movably guided along the pressing direction R. The receptacle 22 has on an underside facing the lower tool 16 an opening 26 which in the example extends inside the piston 30 such that the piston 30 forms a type of cylindrical annular piston. The receptacle 22 is limited in the area of the opening 26 by a guide frame 40 having several guide ducts 42 in each of which one or more plungers 60 are guided axially movably along the effective direction of the press force, i.e. in the pressing direction R. The plungers 60 are preferably manufactured from a resistant material with good thermal conduction, for example of steel or also of another metal or a metal alloy. The guide frame 40 is fastened to the piston 30 with the aid of suitable connecting elements, for example engaging or clamping elements, or bolted to the piston 30, permitting replacement of the guide frame 40.

A flexible membrane 50 covering the guide ducts 42 is arranged between the receptacle 22 and the pressure pad 24. In the example shown in FIGS. 1 and 2, the membrane is shown as a continuous membrane 50, wherein in accordance with a modification described in more detail below the membrane can also be split into several separate membrane sections 50A (FIGS. 5 and 7). The membrane 50 or the membrane sections 50A can for example also be manufactured from a coated glass fiber or aramid fiber fabric (Kevlar) and if desired coated using polytetrafluoroethylene (PTFE) or another material.

The following sets forth the mode of operation of the sintering device 10. As shown in FIG. 1, after the assemblies 12 or the workpiece carrier 18 have been placed on the lower tool 16, the upper tool 14 and the lower tool 16 are first moved closer to one another, which can be achieved by movement of either the upper tool 14 or the lower tool 16. In the situation shown in FIG. 1, the upper tool 14 with the guide frame 40 is just setting down on the lower tool 16, or more precisely on the workpiece carrier 18 mounted on the lower tool 16.

As soon as the guide frame 40 has set down on the workpiece carrier 18, the volume of the receptacle 22 is reduced as the upper and lower tools 14, 16 are moved closer together, since the piston 30 is moved into the cylinder 28. At the same time, a pressure is built up in the pressure pad 24 which moves or displaces the plungers 60 in the direction towards the assemblies 12 and out of the guide ducts 42. The envelope of the pressure pad 24 and also the membrane 50 adjust here largely to the contours of the guide frame 40 or of the upper sides of the plungers 60.

As soon as the plungers 60 make contact with the components 12B, a certain pressure builds up which is initially still very low, until all components 12B have been contacted by the associated plungers 60. The pressure pad 24 permits hydraulic equalization, such that a major pressure rise inside the pressure pad 24 does not take place until all plungers 60 are in contact with the associated components 12B. As a result, a simultaneous and uniform buildup of the press force/pressure is achieved, so that pressure sintering of the assemblies 12 takes place in a very even manner. To determine the pressure, the sintering device 10 can have appropriate sensors. The heat transmission from a heating device (not shown) provided in the upper tool 14 to the assemblies 12 can be achieved by several paths via the cylinder 28, the piston 30, the pressure pad 24, the plungers 60, the guide frame 40 and the membrane 50. A control device, not shown, can control or regulate the process parameters such as pressure, pressing duration and/or press temperature in accordance with a specified process regulation.

After completion of the sintering operation, the upper tool 14 and the lower tool 16 are moved away from one another, such that the workpiece carrier 18 with the assemblies 12 is released and can be removed from the sintering device 10.

With reference to FIGS. 3 to 13, various components of the sintering device 10 in accordance with the exemplary embodiment and modifications thereof are now described in more detail.

FIG. 3 shows the upper tool 14 with the pressure unit 20 and the guide frame 40 fastened thereon. The workpiece carrier 18, which contains several electronic assemblies 12 for sintering in corresponding compartments, is placed on the lower tool 16. To protect the assemblies 12 from fouling or contamination, a foil (not visible in FIG. 3) can be arranged on the workpiece carrier 18 and secured by a foil holding ring 32 placed thereon to prevent unintended slippage. To prevent the foil holding ring 32 in turn from slipping, the workpiece carrier 18 can have an appropriate depression or groove 34. The foil can improve parallel alignment between the upper tool 14 and the lower tool 16 and also height equalization.

The diameter of the foil holding ring 32 can be selected such that the guide frame 40 rests inside the foil holding ring 32 on the workpiece carrier 18 and hence does not come into contact with the foil holding ring 32. Alternatively, a smaller diameter of the foil holding ring can also be selected such that the guide frame 40 rests on the foil holding ring 32, thereby generating the pressure in the pressure unit 20.

FIG. 4 shows the arrangement of FIG. 3 in a side view, wherein only the workpiece carrier 18 is shown, but not the lower tool 16. It can already be seen from FIG. 4 that the guide frame 40 is a multi-part construction of several plates, as is explained in more detail in the following.

The construction of the upper tool 14 including the pressure unit 20 and the guide frame 40 is explained in more detail with reference to FIG. 5. The construction of the pressure unit 20 corresponds to that shown in FIGS. 1 and 2. FIG. 5 and also FIG. 6 illustrate the multi-part construction of the guide frame 40. The guide frame 40 comprises a two-part plunger guide plate 46 with an upper plunger guide plate 46A and a lower plunger guide plate 46B. The guide ducts 42 extend through both plunger guide plates 46A, 46B. The plungers 60 are guided with a certain lateral clearance inside the guide ducts 42 such that the plungers 60 can also tilt to a certain degree inside the guide ducts 42. For example, the guide ducts 42 and the plungers 60 can have a square cross-section, wherein the edge length can be 8.00 mm for the guide ducts 42 and 7.96 mm for the plungers 60. These dimensions are just examples and are in no way restrictive.

The piston 30 can be sealed against the cylinder 28 by a sliding guide insert 166, as FIGS. 18a, 18b explain in detail. Alternatively, a sealing principle using a piston sealing insert as shown in FIGS. 21a, 21b, can be used.

This moderate clearance ensures that the surfaces of the plungers 60 and of the assemblies 12 coming into an operative connection can if necessary align parallel to one another, to prevent gradients forming during exertion of the press force and to further improve the homogeneity of pressing.

As can be readily seen in FIG. 6 in particular, a membrane holding plate 44 is arranged above the plunger guide plate 46 and has several penetrations 48 that are associated with compartments 36 formed in the workpiece carrier 18 for holding the assemblies 12. Each penetration 48 can span several guide ducts 42 and the respective plungers 60 arranged therein.

Each penetration 48 is associated with a respective membrane section 50A which is preferably somewhat larger than the associated penetration 48, such that the membrane sections 50A can be clamped and held in position between the plunger guide plate 46 and the membrane holding plate 44.

The membrane holding plate 44, the upper plunger guide plate 46A and the lower plunger guide plate 46B can be bolted to one another.

As can be seen in FIG. 7, appropriate depressions 54 can be formed on the upper side of the upper plunger guide plate 46A and are matched in their size to the associated membrane sections 50A. In accordance with a configuration, the depths of the depressions 54 can be adjusted to the thickness of the membrane sections 50A such that the membrane sections 50A protrude slightly upwards out of the depressions 54 and can thus be clamped by means of the membrane holding plate 44.

In accordance with a configuration shown in FIGS. 9 and 10, the membrane holding plate 44 can have for each penetration 48 a respective all-round sealing edge 56 which is at a distance from the edge of the penetration 48 and is designed as a kind of bead that clamps the associated membrane section 50A on the peripheral side. The sealing edge 56 can either consist of a flexible material set into the membrane holding plate 44 or be formed by a corresponding projection provided on the membrane holding plate 44.

To prevent the plungers 60 from falling out of the guide ducts when the upper tool 14 is raised, the sintering device 10 can have a securing device for the plungers 60.

In accordance with a configuration of such a securing device, the membrane 50 or the membrane sections 50A can be magnetic, which can be achieved for example by coating the membrane 50 or the membrane sections 50A with a ferromagnetic or paramagnetic material. Alternatively, the magnetic material can also be embedded into the membrane 50 or into the membrane sections 50A in the form of micro- or nanoparticles.

Respective magnetic elements 62 are set preferably flush into the plungers 60 at the ends facing the membrane 50. These magnetic elements 62 manufactured from a temperature-resistant and permanently magnetic material interact with the magnetic membrane 50 and thus prevent the plungers 60 from falling out of the guide ducts 42. To replace the plungers 60 if required, they can be released from the membrane 50 by applying a force that overcomes the holding force. In this configuration, the plunger guide plate 46 can also be designed in one piece.

A further configuration of the guide frame 40, which has an alternative securing device for the plungers 60, is described with reference to FIGS. 12 and 13. The plungers 60 are provided with respective slot-like recesses 64 through which elongated securing pins 66 extend. The securing pins 66 are held in short grooves 52 formed on the upper side of the lower plunger guide plate 46B. To achieve secure holding of the securing pins 66, corresponding grooves (not shown) can also be provided on the underside of the upper plunger guide plate 46A. The securing pins 66 can be clamped between the upper plunger guide plate 46A and the lower plunger guide plate 46B.

The recesses 64 in the plungers 60 are dimensioned such that the axial movability of the plungers 60 necessary for the sintering operation is assured. The securing pins 66 can have a round or even a rectangular cross-section. A respective securing pin 66 can also extend through several plungers 60 if this is necessary for space reasons.

In accordance with a further aspect of the invention, FIGS. 14 and 15a or 15b show a press tool 70 for an embodiment of a sintering device 10. The press tool 70 is shown without guide frame 40 and plunger 60, which would be added in the direction of the press surface 92. The press tool 70 can be designed both as an upper tool and as a lower tool and comprises a baseplate 72 and a cylindrical wall section 74 extending away from the baseplate 72. The square shape of the baseplate 72 in the example and the cylindrical shape of the wall section 74 are purely examples and they can each have diverging shapes.

A hollow space defined by the baseplate 72 and the wall section 74 is closed by a metallic membrane 50. The membrane 50 can be made flat or dished, for example by deep-drawing from a metal membrane or metal foil, wherein a steel alloy, for example a chrome-nickel-steel alloy, is provided as the preferred material for the membrane 50. Plungers 60 can be arranged, for example magnetically fastened, on the press surface 92 of the membrane 50. The membrane 50 borders the hollow space on its side facing away from the baseplate 72, in which for example a pressure pad 90 is holdable. Alternatively, a supporting structure, for example a mechanically soft or liquid metal, a fluid chamber or a silicone pad can also be received in the hollow space. The membrane 50 can have an all-round rim section extending at the sides as far as the wall section 74 and which for example is clamped between the baseplate 72 and a clamping ring 84. The clamping ring 84 can be bolted to the baseplate 72, in particular fastened to the open section of the wall section 74, and can fasten the preferably dish-like rim section of the membrane 50. Alternatively, the membrane 50 can be fastened directly to the wall section 74. An annular piston 76, which can interact as a cylinder with an inner peripheral surface of the wall section 74 and with the pressure pad 90 in the manner described above can be placed in a peripheral groove arranged in the clamping ring 84.

The hollow space formed between the baseplate 72 and the membrane 50 defines a receiving space closed on all sides for a pressure pad or a pressure chamber 90, see FIGS. 15a, 15b. This receiving space can form for example a pressure chamber 90 filled with a fluid, for example silicone or oil, see FIG. 159a, or a pressure pad 90 can be inserted, see FIG. 15b, wherein the pressure pad 90 can for example be an oil-filled pad or a silicone pad or the like. The pressure pad 90 can for example have threaded inserts, allowing the pressure pad 90 to be bolted to the baseplate 72.

The thickness of the membrane 50 is selected such that the membrane 50 has, in the area of a press surface 92 interacting via the plungers 60, not shown, with the electronic assembly components to be connected, a sufficient elasticity to deform by a suitable dimension and to impart via the pressure pad 90 a pressure equalization between adjacent components. The membrane 50 can have a uniform thickness, but also areas of varying thickness. The membrane 50 can thus be thickened or thinned in some areas, and hence have a structure corresponding to differing pressure range zones depending on the arrangement structure of components 130 to be pressed or on the arrangement of plungers 60. The size ratios illustrated in FIGS. 14 and 15a, 15b are not necessarily to scale. In particular, the thickness of the membrane 50 can also be smaller than shown. A plurality of individual membranes 50a can each individually cover penetration areas 48 of a guide frame 40, as shown in FIG. 5.

With reference to FIG. 16, a further embodiment of a sintering device 10 is described, where the features described in this connection can both be realized in combination with the features of the previously described sintering device 10 in accordance with FIGS. 1 to 15 and used in other generically similar sintering devices.

The sintering device 10 shown schematically and not to scale in FIG. 16 comprises a press yoke 112 receiving the upper tool 120 and a press plunger 114 provided underneath the press yoke 112 and holding the lower tool 122 which are movable relative to one another in the direction R by means of a drive in order to apply a press force to the electronic assembly components 130 to be connected and arranged between the upper tool 120 of the press yoke 112 and the lower tool 122 of the press plunger 114. The drive can act on both the press yoke 112 and the press plunger 114 and can be designed for example as a hydraulic press with a press drive 34. An upper press tool 70 is arranged as the upper tool 120 on the underside of the press yoke 112, for example as a hard or soft tool, wherein a graphite foil 140 is provided between the press yoke 112 and the upper tool 120 which can achieve a degree of equalization of pressure or gradient between the press yoke 112 and the upper tool 120 and also parallel alignment and height equalization. The graphite foil 140 can be adapted in its type and thickness such that it can achieve, like an elastic foil, a planar alignment between the upper hard tool 120 and a lower tool 122 when a press force is exerted between the upper and lower tools. As a result, an exact parallel alignment of the upper and lower tools is achievable by means of the graphite foil 140.

The upper tool 120 can be a hard tool, or a soft tool with an elastic sintering pad 24. As the upper tool 120, a previously described upper tool 14 or the press tool 70 shown in FIG. 15a, FIG. 15b or a combination thereof is suitable. FIG. 16 shows as an example of an upper tool 120 a press tool 70 with all-round annular piston 126 for pressing a sintering pad 24, wherein the sintering pad 24 acts via a membrane 50 on individual plungers 60 guided in penetrations 48 of a plunger guide plate 46. The plungers 60 are here aligned with the components to be sintered 130.

On the upper side of the press plunger 114 is a heating plate 124, which can also have one or more cooling devices in addition to one or more heating devices. The lower tool 122, which has on its surface a receptacle for an elastic pressure pad 90, is arranged on the upper side of the heating plate 124. Alternatively or additionally, a pressure pad 24 designed as a soft tool can be provided in the upper tool 120, such that the upper hard tool 120 and/or the lower tool 122 can be replaced by a press tool 70, as shown in FIG. 14, 15a or 15b.

The components 130 to be connected are arranged on the pressure pad 90. A press tool 70 with a continuous metal membrane 50 and plungers 60 guided in penetrations 48 of a guide frame is arranged in the upper tool, the plungers being able to exert a sintering press force on components 130. Optionally, one or more separating foils can be provided below and above the components 130 in order to prevent sticking to the pressure pad 90 or to the plungers 60.

FIGS. 17a to 17c show an embodiment of a diffusion soldering and/or sintering device 10 with a single assembly 12 with a component 130 in combination with a press tool 70, as shown for example in FIGS. 8 and 9a, 9b. The process chamber 160 comprises an upper tool 14 and a lower tool 16. The upper tool 14 is comprised in a press yoke 120.

Inside the lower tool 16, a press drive 34 is arranged which can exert via a press plunger 114 a feed movement onto a component 130 held in a workpiece carrier, not shown, relative to the press tool 70 arranged in the upper tool 14. Several parts 142, for example power semiconductor parts such as IGBTs or similar, are arranged on the component 130 of the assembly 12. The parts 142 of the component 130 can have differing heights and should be connected in a diffusion soldering, bonding or sintering process on the component 130, for example with a cooling structure and connection lines. The component 130 can here be covered with a process covering, not shown, for example a foil or similar, for prevention of fouling and for protection. Fluid ducts 156 for temperature regulation, i.e. for routing a heating or cooling fluid such as oil or air, are integrated into the press yoke 120.

A heating plate 124, which can have identical fluid ducts for heating or cooling, is arranged in the press tool 70 as a heating device 17. The heating plate 124 is the downward limit of a pressure chamber 90, in which a pressure pad can be placed. The pressure chamber 90 has a chamber area 144 which is controllably fillable with fluid. The fluid can be a gas or a liquid. In this embodiment, it is provided that the chamber area 144 is filled with atmosphere gas of the process chamber 160, for example with a cleaning gas such as nitrogen or with air. To do so, two filler valves 146 are provided in the press yoke 120 to enable, via valve actuators 148, fluid-tight closing or opening of the chamber area 144 of the pressure chamber 90 in relation to the process chamber 160.

The pressure chamber 90 is furthermore limited in the direction of the lower tool with a metal membrane as membrane 50. The metal membrane can for example be a steel membrane, e.g. a steel sheet formed into a dish shape. The metal membrane can bulge downwards in the direction of the process chamber 160 due to a fluid filling of the chamber area 144.

A multi-plunger unit 150 is arranged underneath the membrane 50. The multi-plunger unit 150 comprises a guide plate 154 that receives and guides several press plungers 152. The press plungers 152 are used to selectively introduce a press force into predefinable areas of the component 130, and can be adapted in shape and size to the varying geometrical dimensions of the parts 142 into which a press force is to be introduced. During a pressure application, i.e. an activation of the press drive 34, the press plungers 152 are moved inside the guide frame 154 in the direction of the component 130 for selectively exerting a press force.

In the sequence shown in FIGS. 17a to 17c, a pressure should—regardless of a press force generated by the press drive 34—be applied by the membrane 50 bulging out due to a pressure difference between the process chamber 160 and the fluid-fillable chamber areas 144 of the pressure chamber 90. The size of the compressive force is determined from the pressure difference between the chamber area 144 and the process chamber 160, which causes a displacement of the membrane 50 in the direction of the lower tool 16 and thereby exerts a pressure on the component 130.

In a first process step shown in FIG. 17a, the filler valves 146 are in an upper position, so that the chamber area 144 is fluidically connected to the process chamber 160. In the second process step, a vacuum is created in the process chamber 160, which also leads to a vacuum in the chamber area 144. The first and second process steps are shown in FIG. 17a.

In the subsequent third process step, the process chamber 160 is flooded with a cleaning gas such as nitrogen which penetrates into the chamber area 144 of the fluid chamber 90. In the fourth process step, the filler valves 146 are then separated fluid-tightly from the process chamber 160 by means of the valve actuators 148. After that, the press drive 34 is activated, in the fifth process step, until a workpiece carrier (not shown) with the component 130 and a positioned process covering (likewise not shown) is in adjacent contact with the multi-plunger unit 154. The steps three to five are shown in FIG. 17b.

In the following sixth process step, shown in FIG. 17c, the process chamber 160 is evacuated. The membrane 50 here bulges downwards due to the pressure difference between the chamber area 144 of the pressure chamber 90 and the process chamber 160, and moves the press plungers 152 inside the guide frame 154 in the direction of the component 130, such that a compressive force is selectively exerted on the individual parts 142. This allows height differences of the parts 142 to be compensated for, with the press force being finely dosable depending on the pressure difference.

This pressure application resulting from the pressure difference between the process chamber 160 and the pressure chamber 90 can be exerted alternatively or additionally to a press force exerted by the press drive 34. The pressures thereby generatable are as a rule lower and more finely dosable than the mechanical compressive force applied by means of the press drive 34. A bonding method, diffusion soldering method or low-pressure sintering method can be effectively supported therewith.

FIGS. 18a, 18b show two embodiments of sealed press plungers 152. In FIG. 18a, a press plunger 152 made of a hard material such as steel is axially mounted and guided inside a guide duct 42 of a guide frame 40. Above the guide frame 40, a pressure pad 24, for example of silicone, and/or a pressurizable pressure chamber 90 are arranged that is/are sealed by the guide frame 40 and by the press plunger 152 sealed in the direction of the pressure pad 24 or pressure chamber. The press plunger 152 has a plunger underside 170 facing a component 12B to be pressed and a plunger upper side 168 facing the pressure pad 24 or the pressure chamber 90. The cross-sectional shape of the press plunger 152 can be preferably square or rectangular and can have rounded corner areas such that at least one plunger underside 170 is adjustable to a size of a component 12B to be pressed. The axial periphery of the press plunger 152 has a plunger guidance side 162 contacting the inner surface of the guide duct 42 and having in the area of the plunger upper side 168 a plunger guidance side section 164. The plunger guidance side section 164 can be designed radially receding and can hold along its periphery a sliding guide element 166 in the form of a sealing insert to fill in the recess. The sliding guide element 166 can preferably consist of a thermally resistant plastic, silicone or other softer material as the material of the press plunger 152, in particular of a material with a higher thermal expansion coefficient than the plunger material. A suitable material is for example a high-temperature thermoplastic, in particular a polyether ether ketone or polyimide marketed under the brand names PEEK, Tecapeek or Vespel. Furthermore, materials, in particular plastics, with high electrical and thermal conductivity, comprising for example graphite, can be used. The sliding guide element 166 is preferably injection-molded along the plunger guidance side section 164 or printed on directly using a 3D printing method. At the transition of the upper side of the sliding guide element 166 to the plunger upper side 168, a preferably all-round plunger groove 174 is set into the plunger upper side 168, so that the pressure pad 24 can penetrate and, in the event of a thermal expansion due to heating up of the press plunger 152, displaces the upper side of the sliding guide element 166 in the direction of the cylinder wall of the guide duct 42 and thus improves sealing.

In the example in FIG. 18a, the surface of the plunger underside 170 is reduced relative to the surface of the plunger upper side 168, such that the pressure can be increased. In contrast to that, FIG. 18b shows an example of a press plunger 152 whose plunger underside 170 is increased relative to the plunger upper side 168, in order to reduce the pressure or to press a larger surface of a component 12B.

A partly perspective cross-sectional illustration of the sliding guide insert 166 is also shown in an enlarged representation in FIG. 18b. On the side facing the cylinder wall of the guide duct 42, the sliding guide element 166 has a friction-reduced surface contour 176, e.g. a grooved contour, such that the friction during an axial movement of the press plunger 152 relative to the outer wall of the guide duct 42 is reduced.

FIG. 19 shows a further embodiment of a press tool 70 in which a press plunger as shown in FIG. 18a is used as an example. As a rule, a plurality of such press plungers is received in one common guide frame or in several guide frames in the press tool 70. The press tool has an upper tool 14 and a lower tool 16. A workpiece carrier 18 can be held in the lower tool 16. A substrate 12A and a component 12B can be arranged on the workpiece carrier 18 as an assembly 12 to be connected. Optionally, a process cover, e.g. a temperature-resistant foil, can be temporarily arranged between the assembly 12 and the upper tool 14 during the sintering or pressing operation (not shown).

The upper tool 18 comprises a guide frame 40 comprising one or more press plungers 152 held in guide ducts 42. The guide frame seals a pressure pad 24 located above it against the assembly 12. The pressure pad 24 or a pressure chamber 90 can be pressurized or relieved of pressure using a filler valve 146. Two or more positioning elements 172, e.g. indexing rods, are used to position the upper tool 14 relative to the lower tool 14 and to fix a process cover. The positioning elements 172 can be moved in and out using a displacement unit, not shown.

The lower tool 16 can comprise a transport frame for holding a workpiece carrier 18 that is automatically transportable through the sintering device 10 on a transport unit, not shown. The workpiece carrier can be placed into and removed from the lower tool 16. The transport frame can consist of an electrically conductive and pressure-resistant material such as special steel, and for example can have connecting bars of a weight-reduced and also electrically conductive material such as an aluminium alloy.

In addition, FIG. 20 shows in a perspective representation an embodiment of a multi-plunger unit 150 such as can be used in a press tool 70. As a rule, each press plunger 152 is guided inside a guide duct 42 of a guide frame 40. In this embodiment, several press plungers are axially guided along each other and in a common guide duct 42. The press plungers are axially movable against one another. Sealing against a pressure chamber 90, not shown, or a pressure pad 24 can be achieved using a previously described membrane 50 or membrane sections 50A or using sliding guide inserts 166 provided for each press plunger 152. A metal membrane can be advantageously used, wherein the individual press plungers 152 are magnetically fastenable on the metal membrane in a non-positive connection. The multi-plunger unit 150 permits with adjusted lengths and sizes of the individual press plungers 152 pressing or sintering of assemblies 12 with closely adjacent structures of differing heights. A pressure-stable mask can also be placed on a lower tool 16 to allow individual press plungers 152 to pass through while holding back other press plungers 152. A flexible adjustment to different assemblies 12 can thus be achieved by using a pressure mask on the lower tool 16 instead of adapting the guide frame 40 of the upper tool, allowing in particular a flexible and inexpensive adjustment to various pressing and sintering tasks for small runs. It is possible to use a multi-plunger unit 150 instead of an individual plunger 152 in the concept shown in FIGS. 18a, 18b for plunger sealing. Instead of the individual plungers 152 shown in FIGS. 18a, 18b, a plurality of small individual plungers 152 can be used, which are preferably sealed against the pressure pad 24 using a metal membrane on the plunger upper side 168. The individual plungers 152 can adhere magnetically to the metal membrane. It is thus possible, by means of small individual plungers 152 of a multi-plunger unit 150, to press very small part sizes of a few millimeters, e.g. with 5 mm edge length or smaller in a complex part 142, on a component 130 where individual sealing of the small individual plungers 152 would not be possible or only with difficulty.

Finally, FIGS. 21a, 21b show an example of a square piston 30 as an annular piston 76 with a pressure pad 24 as a silicone pad as an example. Due to the square shape of the plunger surface forming the lower pressure pad side 180, plunger shapes can be provided in space-saving manner and adjusted to the usual shape of the assemblies, in particular of power semiconductors such as IGBTs. The lateral edges of the guidance sides of the annular piston 76 are rounded to prevent peak stresses in the area of the cylinder wall and to provide the sealing effect of the piston 30 in the cylinder 28. FIG. 21a shows a plan view and a sectional view A-A of a piston 30 as a rectangular annular piston 76 with rounded lateral edges or guidance sides. The piston 30 comprises a piston skirt 184 made of a hard material, for example steel, and a piston sealing insert 186 made of a soft material, preferably plastic, positively fitted into it. The soft material assists parallel alignment of the plunger 60 relative to the surface of the component 130 or of the assembly on the lower tool 16. The sectional representation A-A shows a section through the piston 30 in the indicated viewing direction for the plan view, folded upwards. The piston 30 has a piston upper side 198 through which the soft pad 24 shown in FIG. 21b that at the same time forms a plunger 60 as a soft plunger passes through and exits on a piston underside 196 when the piston 30 is inserted into a cylinder 28, not shown, since the piston 30 reduces the volume of the pressure pad 24 by resting on the assembly 12, on a workpiece carrier 18 or on the lower tool 16, with simultaneous movement of the upper tool 14 towards the lower tool 16. On the piston upper side 198, the piston skirt 184 of the annular piston 76 has a sealing seat 200 in the form of a protruding all-round edge. A sealing groove 188 is formed by positively fitting insertion of the piston sealing insert 186 from the piston upper side 198. This groove is limited on the sides of the piston sealing insert 186 by a flange area 190 that sits in the sealing seat 200. A soft pressure pad 24 penetrates into the sealing groove 188 when pressure is applied, and prevents penetration of the pressure pad into a gap between the piston 30 and the cylinder 28. The all-round upper edges around the upper side 198 of the annular piston 76, in particular along the sealing seat 200, are sharp-edged to improve the sealing effect, while the all-round lower edges on the underside 196 of the annular piston 76 are rounded to prevent peak stresses to the part or assembly.

FIG. 21b shows in a bottom view and sectional view B-B a pressure pad 24 which in this example is designed as a plunger 60, a so-called soft plunger. The sectional representation B-B must be understood as a folded down representation along the line B-B of the upper bottom view. The pressure pad 24 can be designed as a silicone plunger and can offer in its interior a recess for a hard plunger insert, e.g. a metal block. The underside 180 of the pressure pad can form a plunger press surface. A sealing edge 192 is provided on the upper side 182 of the pressure pad. After a first use for pressing, a seal seam 194 is formed by the displacement of the material of the sealing edge 192 of the pressure pad 24 into the sealing groove 188 of the piston 30, with the seal seam permitting effective sealing of the upper side 182 of the pressure pad against the piston 30 and the cylinder 28 (not shown).

LIST OF REFERENCE NUMERALS

10 Sintering device
12 Assembly
12A Substrate
12B Component
14 Upper tool
16 Lower tool
17 Heating device
18 Workpiece carrier
20 Pressure unit
22 Receptacle
24 Pressure pad
26 Opening
28 Cylinder
30 Piston
32 Foil holding ring
34 Press drive
40 Guide frame
42 Guide duct
44 Membrane holding plate
46 Plunger guide plate
46A Upper plunger guide plate
46B Lower plunger guide plate
48 Penetration
50 Membrane
50A Membrane section
52 Groove
54 Depression
56 Sealing edge
60 Plunger
62 Magnetic element
64 Recess
66 Securing pin
70 Press tool
72 Baseplate
74 Wall section
76 Annular piston
84 Clamping ring
90 Pressure pad
92 Press surface
112 Press yoke
114 Press plunger
120 Upper tool
122 Lower tool
124 Heating plate
126 Annular piston
130 Component
140 Elastic foil/graphite foil
142 Part on component
144 Fillable chamber area of fluid chamber
146 Filler valve
148 Valve actuator
150 Multi-plunger unit
152 Press plunger
154 Guide frame
156 Fluid ducts for temperature regulation
160 Process chamber
162 Plunger guidance side
164 Plunger guidance side section
166 Sliding guide insert
168 Plunger upper side
170 Plunger underside
172 Positioning element
174 All-round plunger groove
176 Friction-reducing surface contour
180 Pressure pad underside
182 Pressure pad upper side
184 Piston skirt
186 Piston sealing insert
188 Sealing groove
190 Sealing insert flange area
192 Pressure pad sealing edge
194 Pressure pad seal seam
196 Piston underside
198 Piston upper side
200 Piston skirt sealing seat
R Pressing direction

The invention claimed is:

1. A diffusion soldering device and/or sintering device for connecting components of at least one electronic assembly by means of diffusion soldering and/or pressure sintering, with an upper tool and a lower tool between which the at least one assembly is held, wherein the upper tool has at least one pressure pad filled or fillable with a fluid or with a displaceable medium whose internal pressure is variable and at least one plunger in operative connection to the pressure pad and configured for transmission of a press force generated by a pressure increase in the pressure pad to the assembly, wherein the upper tool has a guide frame in which the at least one plunger is guided axially movably along the effective direction of the press force, wherein the at least one plunger is guided movably in the guide frame while sealed against the pressure pad wherein the upper tool has at least one pressure unit with a receptacle for the pressure pad, wherein the pressure unit has a cylinder and a piston movably held therein, wherein the cylinder and the piston define the receptacle for the pressure pad such that the volume of the receptacle is variable by movement of the piston.

2. The diffusion soldering device and/or sintering device according to claim 1, wherein the pressure unit has an opening facing the lower tool and covered by the guide frame, the pressure pad resting on the guide frame.

3. The diffusion soldering device and/or sintering device according to claim 2, wherein the opening is provided in the piston.

4. The diffusion soldering device and/or sintering device according to claim 1, wherein the upper tool and the lower tool are movable relative to one another along the effective direction of the press force, wherein the piston is moved into the cylinder when the upper tool contacts the lower tool or a workpiece carrier resting on the lower tool.

5. The diffusion soldering device and/or sintering device according to claim 1, wherein the pressure pad is connected or connectable to a fluid source for supplying fluid into the pressure pad, wherein the pressure increase can be effected by the supply of fluid.

6. The diffusion soldering device and/or sintering device according to claim 1, wherein the guide frame comprises a plunger guide plate having guide ducts for axial guidance of the at least one plunger.

7. The diffusion soldering device and/or sintering device according to claim 6, wherein at least one flexible membrane covering the guide ducts is arranged between the pressure pad and the at least one plunger.

8. The diffusion soldering device and/or sintering device according to claim 6, wherein the membrane covers the guide duct.

9. The diffusion soldering device and/or sintering device according to claim 7, wherein the guide frame has a membrane holding plate which is arranged on a side of the plunger guide plate facing the pressure pad, and wherein the membrane is held between the membrane holding plate and the plunger guide plate.

10. The diffusion soldering device and/or sintering device according to claim 9, wherein the membrane holding plate has at least one penetration which extends at least over the guide ducts.

11. The diffusion soldering device and/or sintering device according to claim 7, wherein the at least one plunger is permanently or detachably connected to the membrane.

12. The diffusion soldering device and/or sintering device according to claim 6, wherein the upper tool has at least one securing device for the at least one plunger which secures the at least one plunger against dropping out of the guide ducts.

13. The diffusion soldering device and/or sintering device according to claim 11, wherein the membrane is magnetic and that the securing device comprises respective magnetic elements (62) connected to the at least one plunger, which hold the at least one plunger on the membrane.

14. The diffusion soldering device and/or sintering device according to claim 12, wherein the securing device comprises respective securing pins mounted in the membrane holding plate and extending though recesses provided in the at least one plunger.

15. The diffusion soldering device and/or sintering device according to claim 6, wherein the at least one plunger is held in the guide ducts with lateral clearance.

16. The diffusion soldering device and/or sintering device according to claim 1, wherein the at least one plunger can have a square or rectangular cross-section, wherein the guidance sides of the at least one plunger are rounded.

17. The diffusion soldering device and/or sintering device according to claim 6, wherein the guide frame has a square or rectangular shape, and the guide ducts have a square or rectangular cross-sectional shape.

18. The diffusion soldering device and/or sintering device according to claim 6, wherein one or more guide ducts holds a plurality of adjacent plungers that are guidable along each other.

19. The diffusion soldering device and/or sintering device according to claim 1, wherein the at least one plunger has a sliding guide insert made of a softer material than the plunger material on an upper guidance side section facing the pressure pad, wherein an all-round plunger groove is provided on the plunger upper side between the upper edge of the sliding guide insert and the plunger upper side.

20. The diffusion soldering device and/or sintering device according claim 1, wherein the at least one plunger on the plunger underside has a smaller or larger cross-section than on the plunger upper side.

21. The diffusion soldering device and/or sintering device according to claim 1, wherein the piston is guided movably while sealed against the cylinder, wherein the piston is formed as an annular piston and comprises a piston skirt of a harder material and a piston sealing insert of a softer material positively held in the piston skirt.

22. The diffusion soldering device and/or sintering device according to claim 21, wherein the piston skirt has a sealing seat on its piston upper side facing the upper tool, in which seat a flange area of the piston sealing insert engages such that an all-round sealing groove is formed, wherein a pressure pad has on the upper side an all-round sealing edge which, when pressure is applied to the piston, can be forced into the sealing groove of the piston with a seal seam being formed.

23. The diffusion soldering device and/or sintering device according to claim 21, wherein the piston and the pressure pad are associated with a plunger, wherein the plunger is designed as a soft plunger and is provided by the pressure pad, or the piston and the pressure pad are associated with a plurality of plungers.

24. A press tool designed as an upper tool or a lower tool of a diffusion soldering device and/or sintering device according to claim 1, comprising a rigid baseplate and either at least one membrane connected to the baseplate which is formed by a flexible dish-shaped membrane made from silicone or a steel alloy or a plurality of membrane sections, in the direction of the press surface, or a guide frame with at least one plunger movably guidable therein, and with a pressure chamber comprising at least one pressure pad filled with a fluid and arranged in a closed receiving space limited by the baseplate and the membrane or the guide frame with at least one sealing plunger, wherein the guide frame closes the at least one pressure pad in the direction of the press surface and guides the at least one plunger.

25. The press tool according to claim 24, wherein at least one sub-area of the pressure chamber is controllably fluid-fillable by means of at least one filler valve.

26. A diffusion soldering facility and/or sintering facility comprising the diffusion soldering device and/or sintering device according to claim 1 and a press tool, wherein the diffusion soldering device and/or sintering device and/or the press tool are arranged in an atmospherically tight module of a multi-module system, wherein at least one further module is provided as a preheating and/or cooling module, and wherein a transport device is provided which is configured to automatically move at least one workpiece carrier with at least one assembly through the multi-module system, and wherein adjacent modules of the multi-module system are sealable atmospherically tight against one another.

* * * * *